United States Patent [19]
Sato et al.

[11] Patent Number: 5,719,487
[45] Date of Patent: Feb. 17, 1998

[54] OUTPUT CONTROLLING APPARATUS FOR VEHICLE GENERATOR

[75] Inventors: Hirohide Sato, Toyokawa; Toshio Tsutsui, Kariya, both of Japan

[73] Assignee: Nippondenso Co., Ltd., Kariya, Japan

[21] Appl. No.: 638,746

[22] Filed: Apr. 29, 1996

[30] Foreign Application Priority Data

Apr. 28, 1995 [JP] Japan .................. 7-105814

[51] Int. Cl.$^6$ ............................ H02P 9/00
[52] U.S. Cl. ............................ 322/28; 322/33
[58] Field of Search ...................... 322/28, 33, 37

[56] References Cited

U.S. PATENT DOCUMENTS

| | | | |
|---|---|---|---|
| 4,584,515 | 4/1986 | Edwards | 322/28 |
| 4,733,159 | 3/1988 | Edwards et al. | 323/282 |
| 4,940,928 | 7/1990 | Nishimura | 322/28 |
| 5,198,744 | 3/1993 | Kohl et al. | 322/33 |
| 5,287,001 | 2/1994 | Buchmann et al. | 257/719 |
| 5,355,123 | 10/1994 | Nishiura et al. | 340/653 |
| 5,512,813 | 4/1996 | Uchinami | 322/28 |
| 5,550,457 | 8/1996 | Kusase et al. | 322/29 |

FOREIGN PATENT DOCUMENTS 3-12047 3/1991 Japan .
4-138030 5/1992 Japan .

*Primary Examiner*—Steven L. Stephan
*Assistant Examiner*—Nicholas Ponomarenko
*Attorney, Agent, or Firm*—Cushman, Darby & Cushman IP Group of Pillsbury, Madison & Sutro LLP

[57] ABSTRACT

An output controlling apparatus for a vehicle generator includes MOSFETs for full-wave rectification of a voltage output by the generator, a MOSFET for turning the flow of a field current on and off and a voltage controller for controlling the MOSFETs to sustain the voltage of a battery at a fixed value. In this configuration, the thermal resistance between the MOSFETs is set at a value smaller than the thermal resistance between the voltage controller and the MOSFETs. In addition, the MOSFETs are fixed on a common good heat conductive substrate to reduce the thermal resistance between the MOSFETs. In this way, the accuracy of the voltage controller is prevented from deteriorating and, at the same time, the maximum temperature of the MOSFETs can be reduced.

28 Claims, 12 Drawing Sheets

OUTPUT CONTROLLING APPARATUS FOR VEHICLE GENERATOR

CROSS-REFERENCE TO RELATED APPLICATION

The present application is related to and claims priority from Japanese Patent Application No. Hei 7-105814, incorporated herein by reference.

BACKGROUND OF THE INVENTION

1. Field of the Invention

The present invention relates to an output controller of an AC generator such as an alternator, and particularly applies to a power generator which also has motor functions.

2. Description of Related Art

One known output controller of a vehicle power generator includes a rectifier composed of semiconductor switching elements (for example, diodes) for individually connecting each terminal of three-phase electric armature windings and positive and negative terminals of a battery, and a voltage controller unit for controlling a power generation voltage by controlling a field current control switch.

For example, Japanese Examined Utility Model Publication No. Hei 3-12047 discloses a voltage regulator which is formed by integrating the field current control switch and the voltage controller unit. Also, in Japanese Patent Laid-Open Publication No. Hei 4-138030, power losses due to PN forward bias voltage drops in the diodes are reduced by replacing each of the diodes of a three-phase full wave rectifier with MOSFETs.

In recent years, for output controllers of power generators, there is a tendency for larger increases in the rise in temperature of voltage regulators (i.e., field current control switches and voltage control units) and rectifiers because of increased output of the power generator due to increased electrical load, rising engine room temperature due to overcrowding in an engine room, rising internal temperature of the power generator due to its downsizing and weight reduction, and increase in the field current due to increased output. Accordingly, there have been problems regarding the bad effects of such trends of rectifiers, electrical semiconductor switching elements which form field current control switches, semiconductor integrated circuits which form voltage control units, and the like.

In reducing the rise in temperature, as described above, the formation of rectifiers using MOS transistors can certainly solve power loss problems due to the PN forward bias voltage drops in the diodes. However, there is a voltage drop of about 0.6 volts in commercial power Si-MOSFETs for regular chip sizes, and so the total power loss (heating) amount for six transistors which form the three-phase full wave rectifier 3 is 108 W, which is a very large amount; therefore, significant improvements over the diode regarding effects on the reduction of power loss and amount of heat generated cannot be achieved easily.

In addition, in order to prevent the temperatures of these rectifiers, field-current controlling switches and voltage controlling units from rising, it is also possible to devise ways to improve the heat radiating fins and ways to increase the amount of cooling air. However, it is of course necessary to increase the sizes of the heat radiating fins and the cooling fan and, thus, the power to drive the cooling fan in order to improve the heat radiating fins and to increase the amount of cooling air, inevitably entailing an increase in generator physique and a decrease in efficiency.

That is, there is a substantial difference in current between semiconductor switching devices which constitute the AC-DC power converter and the field-current controller (hereafter referred to as "power semiconductor switching devices") and a semiconductor integrated circuit constituting the voltage controller. The current through a power semiconductor switching device employed in the AC-DC power converter for turning on and off the flow of the current of the generator is extremely large and generally has a magnitude of several tens of amperes. The current of a power semiconductor switching device employed in the field-current controller for turning on and off the flow of a field current is typically less than that of the AC-to-DC power converter and generally has a magnitude of several amperes. Since the voltage controller merely creates a control signal voltage, the current thereof is extremely small and typically has a magnitude of only a few mA or less. As a result, the amount of power loss and the amount of dissipated heat in the voltage controller, which are proportional to the square of the magnitude of the average current, are extremely small in comparison with those of the AC-DC power converter and the field-current controller.

In contrast, the voltage controller includes an analog-signal processing circuit such as a comparator requiring high accuracy in addition to an A/D converter which also requires high accuracy, even in digital processing. It is thus necessary to significantly suppress variations in temperature which occur in the semiconductor integrated circuit composing the voltage controller. That is to say, if the resistances of resistors employed in an operational amplifier or the like change due to variations in temperature, the accuracy of the control signal deteriorates, thus giving rise to a possibility that the battery is excessively charged or discharged, and the life of the battery is shortened as a result. In particular, it is necessary to employ a bipolar integrated circuit in the comparator and the A/D converter if accuracy is to be taken into consideration. Since the current amplification factor of a bipolar transistor varies much with temperature, however, it is necessary to effectively prevent an increase in temperature from occurring in the silicon semiconductor integrated circuit constituting the voltage controller in order to preserve the accuracy of the voltage controller. Nonetheless, since the amount of power consumed by the voltage controller is small as described above, it is easy to remove heat dissipated therefrom.

A problem encountered in a vehicle generator output controller including an AC-DC power converter, the field-current controller and the voltage controller, is that if the three units are installed at locations close to each other, the voltage controller is heated up by heat dissipated by the AC-DC power converter and the field-current controller, thereby unavoidably raising the temperature of the voltage controller. In particular, the voltage controller is connected to the AC-DC power converter and the field-current controller by wires exchanging signals between them. As a result, even if the voltage controller is installed at a location which is as far away as possible from the AC-DC power converter and the field-current controller, the radiated heat is transferred to the voltage controller through the wires which have high heat conductivity, thereby heating up the voltage controller and inevitably raising the temperature of the voltage controller. Of course, it is possible to install the voltage controller at a location even farther away from the AC-DC power converter and the field-current controller by using extended wires and by reducing the cross-sectional area of each of the wires in order to decrease the amount of heat transferred therethrough. In this case, however, the extension of the conductors inevitably entails an increased amount of power loss and an increased amount of superpositioned field noise as well as more complex installation work. Likewise, the reduced cross-sectional area of each of the conductor wires unavoidably entails an increased amount of power loss and an increased amount of resistance noise.

SUMMARY OF THE INVENTION

In view of the above-described problems of the prior art, it is an object of the present invention to provide an output controller for a vehicle generator which allows the generator to produce a large output, where the size and weight of the generator can be reduced without increasing the size of a generator cooling mechanism or the power to drive a fan, while preventing the signal-processing accuracy of the voltage controller from deteriorating.

The above objects are achieved according to a first aspect of the invention by providing an output controller for a vehicle generator in which semiconductor switching devices employed in an AC-DC power converter each carry out full-wave rectification on a voltage output by the generator, a semiconductor switching device employed in a field-current controller turns on and off the flow of a field current, and a semiconductor integrated circuit employed in a voltage controller controls the semiconductor switching devices to regulate the voltage of a battery to a predetermined level.

In particular, according to this aspect of the invention, thermal resistance between the AC-DC power converter and the field-current controller is set at a small value in comparison with thermal resistance between the AC-DC power converter and the voltage controller and thermal resistance between the field-current controller and the voltage controller. In such a scheme, the following effects are obtained.

In the first place, as described above, the amount of heat dissipated by the voltage controller itself is small and an increase in temperature observed in the voltage controller is mainly caused by heat dissipated by the semiconductor switching devices employed in the AC-DC power converter and the field-current controller. Accordingly, by increasing the thermal resistance between the AC-DC power converter and the voltage controller and the thermal resistance between the field-current controller and the voltage controller, the amount of heat transferred from the AC-DC power converter and the field-current controller to the voltage controller can be reduced, preventing the temperature of the voltage controller from being increased by the heat, and preventing the accuracy of the voltage controller from deteriorating due to an increase in temperature.

In the second place, according to this aspect of the invention, the thermal resistance between the AC-DC power converter and the field-current controller is set at a value smaller than the thermal resistance between the AC-DC power converter and the voltage controller and the thermal resistance between the field-current controller and the voltage controller. In such a scheme, the following effects are obtained.

As described above, the AC-DC power converter and the field-current controller incur a large amount of power loss and, thus, dissipate a large amount of heat. Naturally, an attempt is made to enhance the cooling function of a radiator with, e.g., cooling fins and a heat sink or the attraction of cooling wind because of limits of temperatures at which the semiconductor materials such as Si and SiC can be used. However, the degrees to which power loss is incurred and heat is dissipated in the AC-DC power converter are not always the same as those in the field-current controller. For example, the amount of dissipated heat in one of the two is large while that in the other is small. In such a case, by setting the thermal resistance between the two to a small value, heat dissipated by one of the units can be transferred to the other. To be more specific, when the AC-DC power converter dissipates more heat than an average amount of heat dissipated by the field-current controller, (that is, for example, when the amount of heat dissipated by the field-current controller has not reached a maximum in spite of the fact that the amount of heat dissipated by the AC-DC power converter has attained a maximum), the heat dissipated by the AC-DC power converter is bypassed to the cooling and heat-sinking facilities of the field-current controller, thereby allowing an increase in temperature of the AC-DC power converter to be suppressed. In a reverse case, an increase in temperature of the field-current controller can also be suppressed as well by applying the same principle. That is to say, by sharing the common cooling and heat-sinking facilities among the two, the maximum temperatures of the two can be reduced.

On the top of that, since the AC-DC power converter and the field-current controller can be installed close to each other, space required for the installation work can be reserved with ease and the wiring between the voltage controller and these two units can be simplified.

As a result, the cooling of the AC-DC power converter and the field-current controller can be simplified while preventing the accuracy of the voltage controller from deteriorating. In this way, the size of the cooling mechanism can be prevented from increasing and an increase in required fan driving power can be avoided, thereby allowing the output of the generator to be increased while reducing the size and the weight thereof.

The AC-DC power converter, the field-current controller and the voltage controller may be fixed on the housing of the vehicle generator, thus allowing the housing to be utilized as a receiver of radiated heat as well as a heat sink. Also, the AC-DC power converter, the field-current controller and the voltage controller may be accommodated in packages separated from each other, thereby allowing the relations among the thermal resistances to be implemented with ease without increasing the number of packages unnecessarily.

The AC-DC power converter and the field-current controller according to the first aspect described above are further fixed on the housing of the vehicle generator while the voltage controller according to the first aspect is further installed as a unit separated from the generator, thereby allowing the thermal resistance between the AC-DC power converter and the field-current controller to be reduced, and the thermal resistance between the AC-DC power converter and the voltage controller as well as the thermal resistance between the field-current controller and the voltage controller to be increased.

The AC-DC power converter and the field-current controller may be fixed on a common heat transferring substrate having good thermal conductivity which is fixed on the housing of the generator. Preferably, the heat transferring substrate is made from a material such as ceramic or resin of a metal or a metal compound having a coefficient of thermal conductivity significantly greater than that of ordinary ceramic or resin.

In this way, the good heat conductive substrate on which the AC-DC power converter and the field-current controller are fixed in advance is assembled in the housing, thus allowing the assembly work to be carried out with ease.

Additionally, since the good heat conductive substrate serves as a common heat sink and a receiver of heat dissipated by the AC-DC power converter and the field-current controller, the number of components can be reduced.

It is also possible to include heat-conduction resisting devices between the voltage controller and the AC-DC power converter and between the voltage controller and the field-current controller, but not between the AC-DC power converter and the field-current controller. The heat-conduction resisting devices are used for reducing the amounts of heat conducted to the voltage controller from the AC-DC power converter and the field-current controller, thereby allowing the apparatus to be implemented with ease and with a high degree of reliability.

The cross-sectional area of a portion of a connection conductor electrically connecting the AC-DC power converter or the field-current controller to the voltage controller may be made smaller than the cross-sectional area of the rest of the connection conductor in order to effectively reduce the amount of heat conducted from the AC-DC power converter or the field-current controller to the voltage controller through the connection conductor. Also, the cross-sectional area of a portion of a connection conductor electrically connecting the AC-DC power converter or the field-current controller to the voltage controller may be bent in order to effectively reduce the amount of heat conducted from the AC-DC power converter or the field-current controller to the voltage controller through the connection conductor without increasing the wiring space for the connection conductor.

The AC-DC power converter and the field-current controller may be fixed on a heat radiating member exhibiting a good heat radiating effect, such as a good heat conductive substrate or cooling fins, and the thermal resistance between the heat radiating member and the AC-DC power converter and the thermal resistance between the heat radiating member and the field-current controller are set to values smaller than the thermal resistance between the heat radiating member and the voltage controller. It should be noted that the heat conductive substrate includes a cooling block and a heat sink. In this way, the relations among the thermal resistances described above can be implemented and, at the same time, the cooling of the AC-DC power converter and the field-current controller can be carried out with ease. In particular, in the case wherein the three units are built in a single body, that is, the three units are integrated into a single semiconductor chip or accommodated in a common package or the three units are mounted on a common substrate, the heating-up of the voltage controller particularly caused by the AC-DC power converter and the field-current controller can be relieved, thus allowing accurate operations of the voltage controller to be implemented.

A resin member may be provided between the voltage controller and the housing of the generator without providing such a resin member between the AC-DC power converter and the housing or between the field-current controller and the housing. In this way, the amount of heat conducted from the AC-DC power converter and the field-current controller to the voltage controller through the housing can be reduced without obstructing heat conduction from the AC-DC power converter and the field-current controller to the housing.

The AC-DC power converter or the field-current controller may be implemented using MOSFETs. Since a MOSFET can operate with a small control power in comparison with a bipolar transistor, the amount of power consumed by the voltage controller can be decreased, thus allowing the increase in temperature thereof to be reduced further.

The MOSFETs may be made using monocrystalline SiC, thereby permitting the reduction of the amount of incurred power loss and the amount of radiated heat in the AC-DC power converter and the field-current controller as well as the enhancement of the withstand voltages of the MOSFETs to be implemented.

The AC-DC power converter and the field-current controller may be fixed on a common good heat conductive substrate, allowing the good heat conductive substrate itself to serve as a common receiver as well as a heat sink of heat dissipated by the AC-DC power converter and the field-current controller; that is, by allowing a common heat receiver and heat sink to be shared by both units. As a result, when the temperature of one of the units is high while the temperature of the other unit is low, the unit with a high temperature can dissipate much heat to the good heat conductive substrate, thereby allowing the temperatures of the two units to be greatly reduced in comparison with a case in which the two units are fixed separately from each other. On the top of that, the reliability and life of each of the units can be increased and lengthened, respectively. In addition, by using the good heat conductive substrate common to the two units, the number of components can be reduced and, by installing the good heat conductive substrate in the generator after fixing the two units to the substrate, assembly work can be simplified. It should be noted that by fixing the good heat conductive substrate to the housing of the generator, the heat conductive substrate can serve as a good heat conductive path to the housing.

Heat-conduction resisting devices may be provided between the voltage controller and the AC-DC power converter and between the voltage controller and the field-current controller, but not between the AC-DC power converter and the field-current controller. The heat-conduction resisting devices are used for reducing the amount of heat conducted to the voltage controller from the AC-DC power converter and the field-current controller, thus permitting the apparatus to be implemented with ease and with a high degree of reliability.

The cross-sectional area of a portion of a connection conductor electrically connecting the AC-DC power converter and the field-current controller to the voltage controller may be made smaller than the cross-sectional area of the rest of the connection conductor in order to effectively reduce the amount of heat conducted from the AC-DC power converter and the field-current controller to the voltage controller through the connection conductor.

The cross-sectional area of a portion of a connection conductor electrically connecting the AC-DC power converter and the field-current controller to the voltage controller may also be bent in order to effectively reduce the amount of heat transfer from the AC-DC power converter or the field-current controller to the voltage controller through the connection conductor without increasing the wiring space for the connection conductor.

A semiconductor switching device employed in the field-current controller and semiconductor switching devices serving as the high-side switches employed in the AC-DC power converter may be integrated into a single semiconductor chip. In this way, the number of chips, the amount of wiring and the size of the output controlling apparatus can be reduced.

The semiconductor switching devices may be integrated on an N+ substrate having an N− withstand-voltage layer. In this way, the N+ substrate can serve as a connection point common to the semiconductor switching devices, thereby allowing the structure to be simplified. In addition, the N– withstand-voltage layer is useful for withstand-voltage preservation. In particular, if the same MOSFET as an NMOS-FET of the source-follower type serving as a high-side switch is used as a field-current controlling switch, MOSFETs serving as the semiconductor switching devices can be manufactured using common processes and a high withstand voltage can be preserved without shorting a parasitic diode including the N– withstand-voltage layer in order to set the potential of a P-type well.

The semiconductor switching device (in the high-side configuration) of the field-current controller and the high-side switches described above may be fixed on a good heat conductive substrate provided between the positive terminal of a battery and the generator. In this way, the good heat conductive substrate itself serves as a wiring path, allowing the wiring to be simplified.

The semiconductor switching device (in the low-side configuration) of the field-current controller and the low-side switches described abose may be fixed on a good heat conductive substrate provided between the negative terminal of a battery and the generator. In this way, the good heat conductive substrate itself serves as a wiring path, allowing the wiring to be simplified.

The semiconductor switching devices employed in the AC-DC power converter can carry out full-wave rectification on a voltage output by the generator so that the semiconductor switching device employed in the field-current controller turns on and off the flow of a field current, and a semiconductor integrated circuit employed in a voltage controller controls the semiconductor switching devices to keep the voltage of a battery at a predetermined value.

In particular, the AC-DC power converter and the field-current controller are fixed on the housing of the generator while the voltage controller is installed outside the housing. The AC-DC power converter and the field-current controller can thus utilize the housing having a good heat-conduction characteristic and a large thermal capacity as a heat receiver as well as a heat sink. On the top of that, the heat dissipated by the AC-DC power converter and the field-current controlling mean hardly affects the voltage controller.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

A first preferred embodiment of the present invention is explained below with reference to FIG. 1.

Figure 1:
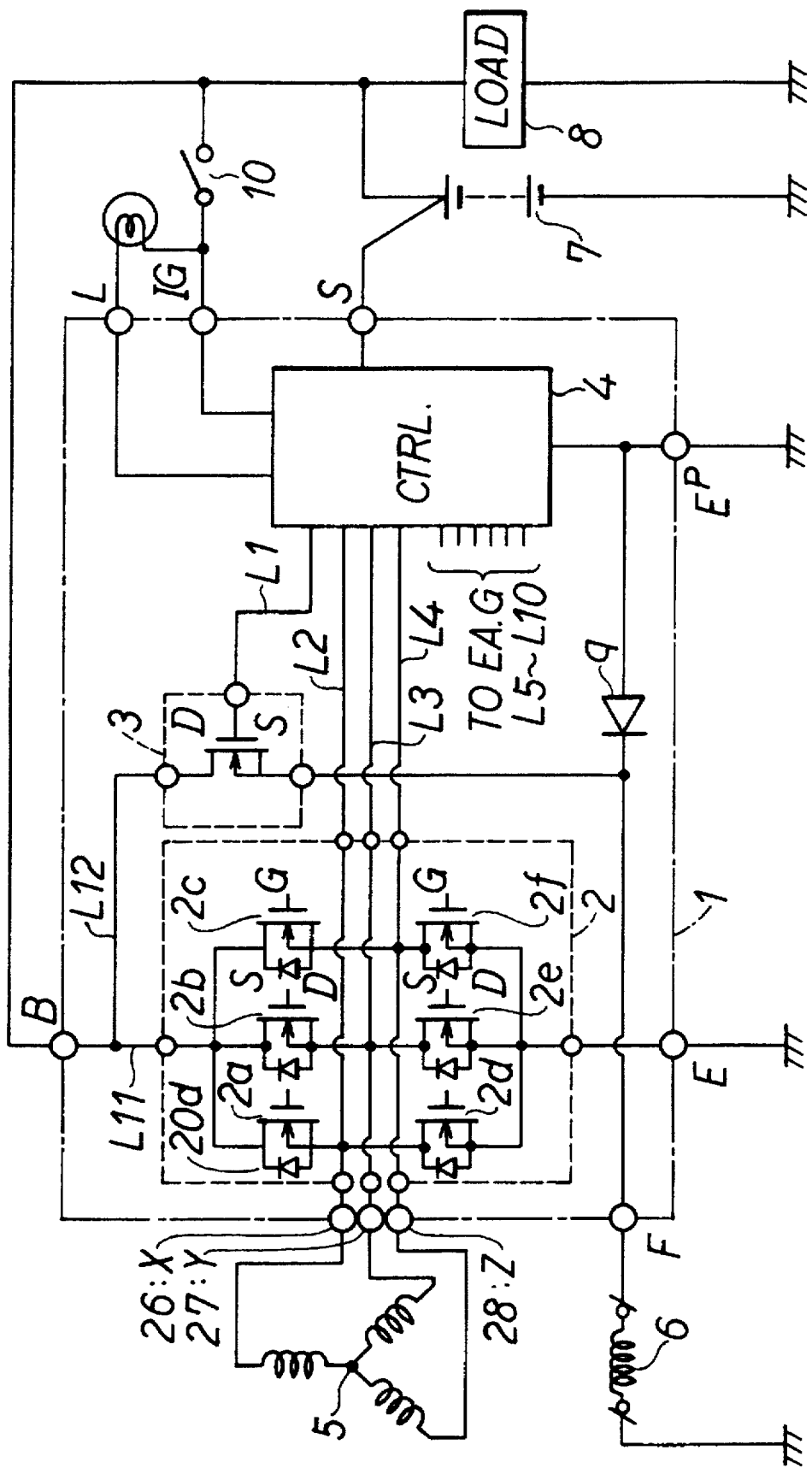
FIG. 1 is a schematic diagram of a first preferred embodiment of the present invention.

As shown in FIG. 1, an output controlling apparatus of a vehicle generator includes a three-phase full-wave rectifier 2 serving as an AC-DC power converter, a controller 4 serving as a voltage controller, a field-current controlling switch 3 serving as a field-current controller and a flywheel diode 9. Three-phase alternating-current voltages output by armature windings 5 of the vehicle generator are applied to alternating-current input terminals of the three-phase full-wave rectifier 2 through output terminals X, Y and Z respectively. The three-phase alternating-current voltages are rectified by the three-phase full-wave rectifier 2 before being supplied to a battery 7 and an electrical load 8 through a high-potential DC output terminal B. The high-potential DC output terminal B supplies a field current to a field winding through an N-channel MOSFET connected in a source-follower circuit which serves as the field-current controlling switch 3. The controller 4 controls the operations of the three-phase full-wave rectifier 2 and the field-current controlling switch 3, sustaining the potential of the battery 7 at a predetermined level. Reference numeral 10 is an ignition switch.

The three-phase full-wave rectifier 2 is an inverter circuit including N-channel MOSFETs serving as high-side switches 2a to 2c and N-channel MOSFETs serving as low-side switches 2d to 2f. The drains of the high-side switches 2a to 2c are respectively connected to the output terminals X, Y, Z of the armature windings 5, and the sources thereof are connected to the high-potential DC output terminal B. On the other hand, the sources of the low-side switches 2d to 2f are respectively connected to the output terminals X, Y, Z of the armature windings 5 and the drains thereof are connected to a low-potential DC output terminal E. The MOSFETs 2a to 2f are turned on and off by the controller 4. That is, the controller 4 compares the voltages between the armature windings with the voltage of the battery 7, turning on and off the MOSFETs 2a to 2f in accordance with results of the comparison. For example, if the voltage between the X and Y phases is higher than the voltage of the battery 7, the MOSFETs 2a and 2e are turned on. At that time, a current flows through a channel region and a parasitic diode 2ad of the MOSFET 2a, then the battery 7 and, finally, the MOSFET 2e. Likewise, if the voltage between the Y and Z phases is higher than the voltage of the battery 7, the MOSFETs 2b and 2f are turned on, and if the voltage between the Z and X phases is higher than the voltage of the battery 7, the MOSFETs 2c and 2b are turned on, thereby allowing a rectified current to flow to charge the battery 7. Such control itself is readily apparent to those of ordinary skill in the art and can therefore be carried out by the controller 4, which is normally implemented using a microcomputer, with ease. Thus, for simplicity, no flowchart showing the control operations is shown. The MOSFETs 2a to 2f and the MOSFET 3 are each an enhancement-type MOSFET which is made from monocrystalline SiC.

The field-current controlling switch 3 turns the flow of a field current through a field winding 6 on and off. The controller 4 reduces the conductivity of the field-current controlling switch 3 when the detected magnitude of the voltage of the battery 7 exceeds an adjustment voltage of typically 14V set in advance, thereby decreasing the output current. Conversely, when the voltage of the battery 7 goes below the adjustment voltage, the conductivity of the field-current controlling switch 3 is increased. In this way, the voltage of the battery 7 is sustained at a predetermined level. Such control can be carried out by the controller 4 in a manner readily apparent to those of ordinary skill in the art. An IG terminal is the supply terminal of the power voltage whereas an L terminal is a terminal for turning on an indicator lamp. When the generator is out of order or when the supply of power is interrupted, current flowing through the lamp turns on the lamp, thereby notifying the operator of the abnormality.

As described so far, in the above control example, the output of the generator is controlled by merely controlling the field current using the field-current controlling switch 3. It should be noted, however, that the control of the output of the generator is not limited to the example described above. The current output by the generator can also be adjusted by controlling the conduction timing of the transistors used in the three-phase full-wave rectifier 2. In addition, by controlling the conduction periods of the MOSFETs 2a to 2f employed in the three-phase full-wave rectifier 2 in accordance with the phase angle of the rotor, the generator can of course be operated not only as power generating equipment, but also as an electric motor.

Figure 2:
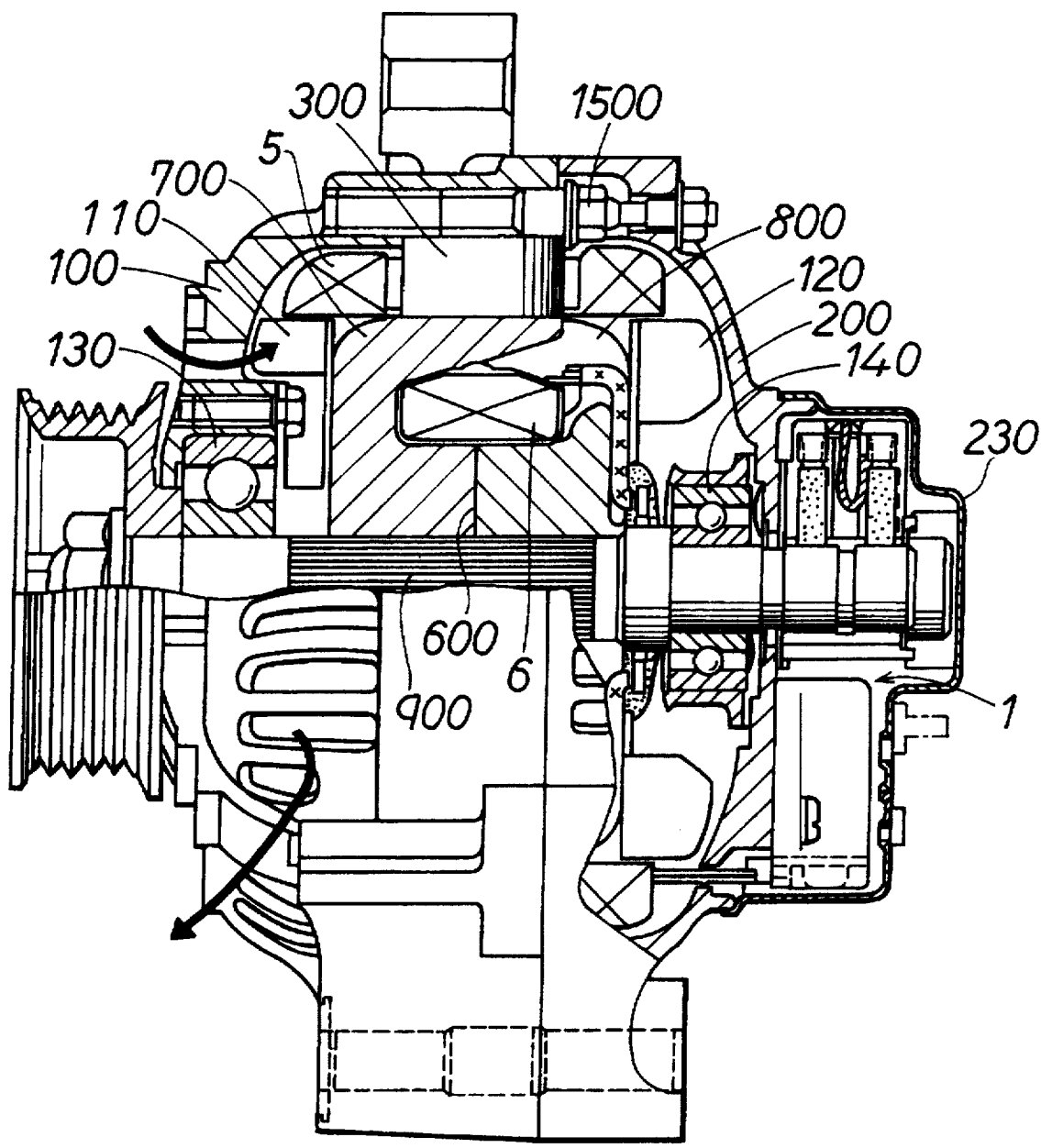
FIG. 2 is a partial cross-sectional view of a generator used in the first embodiment.

Next, the generator is described with reference to FIG. 2. As shown in the Figure, the generator has a drive frame 100 and a rear frame 200 which are directly joined to each other by a plurality of stud bolts 1500. A stator core 300 is fixed on the inner circumference of the frames 100 and 200. The three-phase armature windings 5 are wound around the stator core 300. Bearings 130 and 140 fixed on the frames 100 and 200 support a shaft 900 so that the shaft 900 can rotate freely. A rotor core 600 fixed on the shaft 900 is positioned inside the inner circumference of the stator core 300. A field winding 6 is wound around the rotor core 600. Cooling fans 110 and 120 for blowing cooling air are provided on both end surfaces of pole cores 700 and 800. In addition, the output controlling apparatus 1 which is fixed on the external end surface of the rear frame 200 is cooled by the cooling air blown by the cooling fans 110 and 120.

Figure 3:
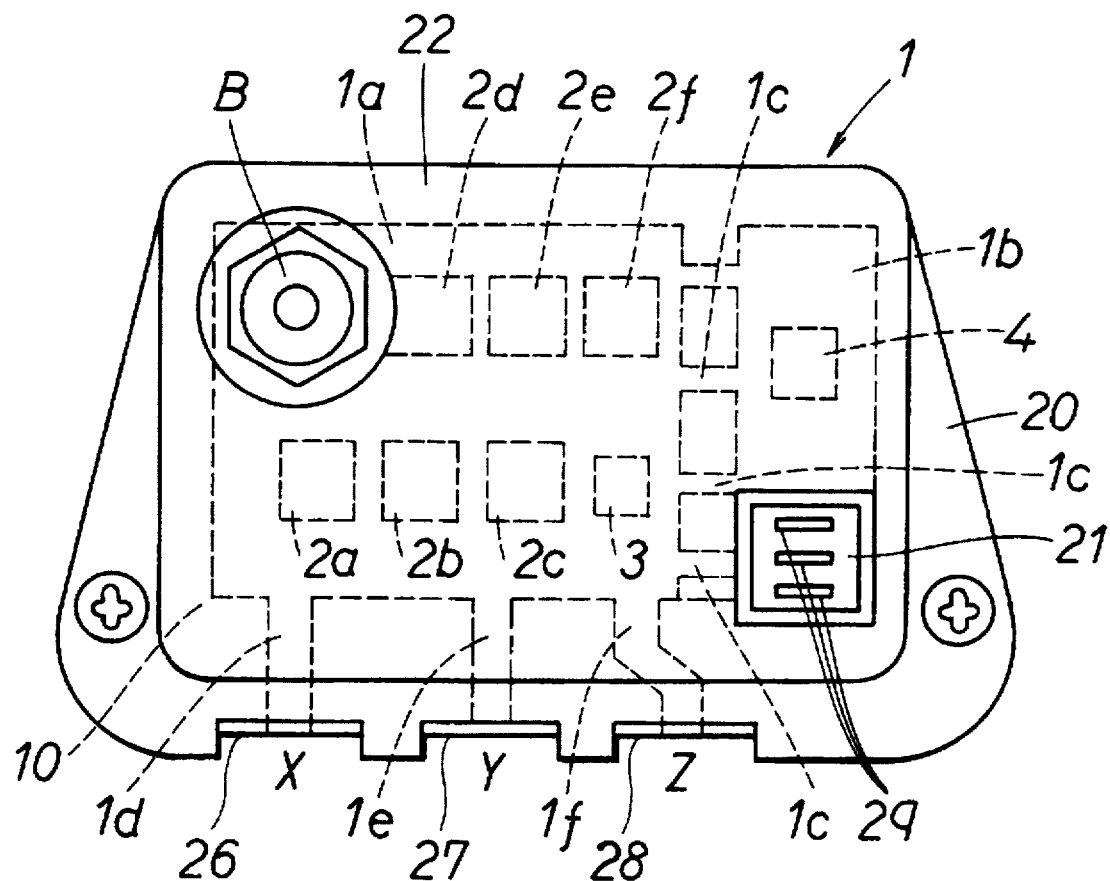
FIG. 3 is a plane diagram of an output controlling apparatus used in the first embodiment.
Figure 4:
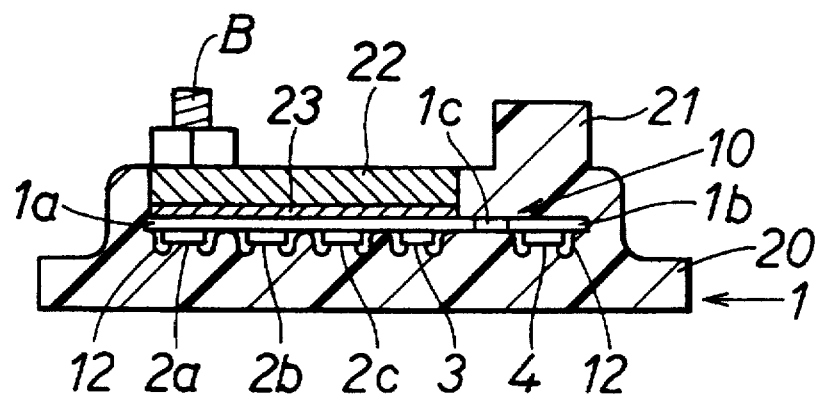
FIG. 4 is a horizontal cross-sectional view of the output controlling apparatus shown in FIG. 3.

A front view of the output controlling apparatus 1 is shown in FIG. 3, and a horizontal cross-section thereof is shown in FIG. 4. The output controlling apparatus 1 including the three-phase full-wave rectifier 2, the field-current controlling switch 3, the controller 4 and the flywheel diode 9 is accommodated in a single package. It should be noted that in FIG. 3, the MOSFETs 2a to 2f are shown to represent the three-phase full-wave rectifier 2. Wiring among the MOSFETs 2a to 2f is provided on a circuit substrate 1a. In addition, being small, the flywheel diode 9 is not shown in the Figure.

The MOSFETs 2a to 2f, the field-current controlling switch 3 and the controller 4 are each preferably fabricated on separate chips. The chips of the MOSFETs 2a to 2f, the field-current controlling switch 3 and the controller 4 are fixed separately from each other on a circuit substrate 10. Internal wiring of the output controlling apparatus 1, which is not shown in the Figure, is also provided on the circuit substrate 10. Contact electrodes (also not shown) on each of the chips are connected to the internal wiring by bonding wires. The substrate of each of the chips is also adhered to the internal wiring in such a way that electric conduction is possible.

As shown in FIG. 3, the circuit substrate 10 includes a power-substrate portion 1a, a control-substrate portion 1b and a plurality of thin-substrate portions 1c connecting the power-substrate portion 1a and the control-substrate portion 1b. The MOSFETs 2a to 2f and the field-current controlling switch 3 are fixed on the power-substrate portion 1a whereas the controller 4 is fixed on the control-substrate portion 1b. Signal lines L1 to L10 shown in FIG. 1 connecting the MOSFETs 2a to 2f, the field-current controlling switch 3 and the controller 4 are fixed on the thin-substrate portions 1c.

Figure 5:
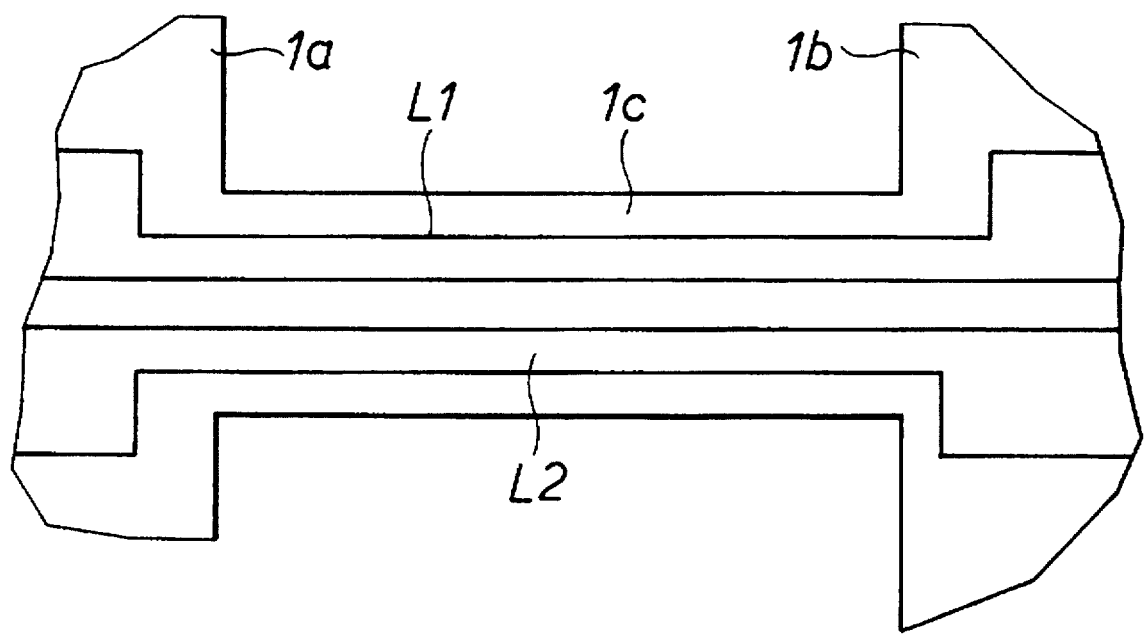
FIG. 5 is an enlarged diagram of a thin-substrate portion in FIG. 3 and areas close thereto.

As shown in FIG. 5, portions of the signal lines L1 to L10 on the thin-substrate portions 1c are thinner than portions of the signal lines L1 to L10 on surfaces other than the thin-substrate portions 1c. In this way, the amount of heat conducted from the power-substrate portion 1a to the control-substrate portion 1b through the thin-substrate portions 1c and the amount of heat transfer through the signal lines L1 to L10 can be reduced. In addition, since only portions of the signal lines L1 to L10 on the thin-substrate portions 1c are thin, the electrical resistances of the signal lines L1 to L10 as a whole are not increased to values that cause a hindrance to the transmission of signals.

In the embodiment described above, the circuit substrate 10 is typically an insulation substrate having conductor layers. It should be noted, however, that the circuit substrate 10 can also be a substrate having a metal punching pattern like a lead frame. Also in this case, portions of the signal lines L1 to L10 on the thin-substrate portions 1c shown in FIG. 3 are made thin, thereby increasing the thermal resistances thereof as is the case with the embodiment described above.

A radiator plate 22, e.g., a thick aluminum plate, is adhered to the back side of the chip mounting surface of the power-substrate portion 1a through a thin resin plate 23 for electrical insulation. A bolt-shaped B terminal passes through holes in the resin plate 23 and the radiator plate 22 and is soldered to a contact conductor layer on the back surface of the power-substrate portion 1a.

As shown in FIG. 1, the B terminal is connected to the source electrodes of the MOSFETs 2a to 2c serving as high-side switches and the drain electrode of the field-current controlling switch 3. In the present embodiment, the radiator plate 22 is electrically connected to the B terminal. However, the radiator plate 22 and the B terminal can of course be electrically isolated from each other. The radiator plate 22 is cooled by an air flow through radiator fins which are not shown in the Figure.

The circuit substrate 10, the chips 2a to 2f, 3 and 4, the resin plate 23, the radiator plate 22 and the B terminal are accommodated in a resin package 20 formed by resin molding to form a single body. Alternating-current terminals 26 to 28 and three connector terminals 29 are fixed on the resin package 20. The alternating-current terminals 26 to 28 are connected to connection points between the MOSFETs 2a and 2d, between the MOSFETs 2b and 2e and between the MOSFETs 2c and 2f, respectively. The three connector terminals 29 protrude into the opening of a connector forming a portion of the resin package 20. The three connector terminals 29 form terminals L, IG and S respectively. It should be noted that ground terminals E and E' and a field-current outputting terminal F are not shown in FIGS. 3 and 4.

It is obvious from FIG. 3 that since the distance from the controller 4 dissipating a small amount of heat to the MOSFETs 2a to 2f and the distance from the controller 4 to the field-current controlling switch 3, to which MOSFETs 2a to 2f and switch 3 each dissipate a large amount of heat, are made longer than the distance from the MOSFETs 2a to 2f to the field-current controlling switch 3, the thermal resistances between the controller 4 and the MOSFETs 2a to 2f and between the controller 4 and the field-current controlling switch 3 are larger than the thermal resistance between the MOSFETs 2a to 2f and the field-current controlling switch 3. In addition, since the thin-substrate portions 1c between the power-substrate portion 1a and the control-substrate portion 1b are each thinner than the power-substrate portion 1a and the control-substrate portion 1b, the relation between thermal resistances through these substrates is similar to the relation between the thermal resistances described above. It should be noted that, in this embodiment, typically, the substrates are each made of ceramic such as alumina with a coefficient of thermal conductivity larger than that of the resin package 20. In addition, since portions of the signal lines L1 to L10 on the thin-substrate portions 1c are thin as shown in FIG. 4, the thermal resistances of the signal lines L1 to L10 are increased. On the top of that, since the radiator plate 22 is joined to the power-substrate portion 1a but not to the control-substrate portion 1b, only the thermal resistances between the field-current controlling switch 3 and the MOSFETs 2a to 2f on the power-substrate portion 1a are reduced.

As a result, the field-current controlling switch 3 and the MOSFETs 2a to 2f which are made of heat dissipating elements and are capable of operating at relatively high temperatures have a common radiator system, the radiator plate 22, allowing the field-current controlling switch 3 and the MOSFETs 2a to 2f to operate at temperatures higher than the operating temperature of the controller 4. In this way, the simplification of the radiator system and more effective utilization thereof can be implemented.

To put it in more detail, the amount of heat dissipated by the MOSFETs 2a to 2f and the amount of heat dissipated by the field-current controlling switch 3 have heat dissipating patterns which differ from each other depending upon the operating mode. Nonetheless, by employing a common radiator system, the temperatures of the MOSFETs 2a to 2f and the field-current controlling switch 3 can be adjusted to an average, preventing the temperatures from rising to a high value.

In the case of a constant electrical load, for example, the generator output is small at low rotational speeds. In this case, the amount of heat dissipated by the three-phase full-wave rectifier 2 is relatively small and the battery supplies power, compensating the output current for the output shortage. Since the field-current controlling switch 3 has a large field current flowing therethrough, however, the amount of heat dissipated thereby reaches a maximum value. When the generator operates at a high rotational speed, on the other hand, the generator output is large and the amount of heat dissipated by the three-phase full-wave rectifier 2 is therefore increased, but the amount of heat dissipated by the field-current controlling switch 3 is reduced. That is to say, there is a difference in the condition for dissipating most heat between the three-phase full-wave rectifier 2 and the field-current controlling switch 3. Accordingly, the maximum temperatures can be reduced by providing a cooling system common to the three-phase full-wave rectifier 2 and the field-current controlling switch 3 rather than two separate cooling systems. On the top of that, with a common cooling system, the configuration thereof can be made simpler.

On the other hand, in spite of the fact that the MOSFETs 2a to 2f, the field-current controlling switch 3 and the controller 4 are accommodated in the same package in order to reduce the number of components and thereby simplify wiring work and enhance reliability, it becomes more difficult for the MOSFETs 2a to 2f and the field-current controlling switch 3 to radiate heat to the controller 4. As a result, it is possible to prevent the temperature of controller 4 from rising and thereby to guarantee its operating reliability.

Figure 6:
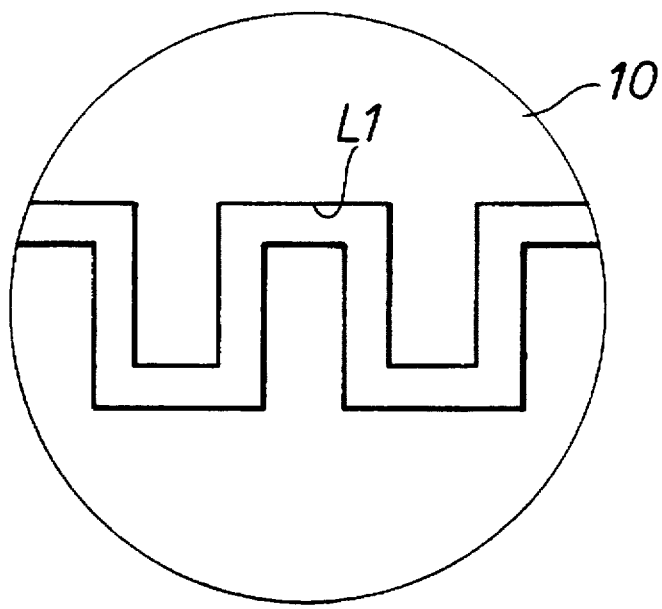
FIG. 6 is an enlarged diagram of a portion of an isolation circuit substrate implemented in a variation on the first embodiment.

FIG. 6 shows a version wherein a portion of a signal line on the circuit substrate 10 is bent in order to increase the thermal resistance thereof. By bending the signal lines L1 to L10, the thermal resistances thereof can be increased without the need to increase the size of the package 20. Of course, by increasing the size of the package 20 or splitting it up into several packages, the lengths of the signal lines L1 to L10 are increased, again raising the thermal resistances thereof.

As shown in FIG. 3, the power-substrate portion 1a is connected to the control-substrate portion 1b by the thin-substrate portions 1c. As an alternative, the power-substrate portion 1a and the control-substrate portion 1b can also be built on two separate substrates and connected to each other by the signal lines L1 to L10 made of conductor lines such as, ideally, bonding wires or leads. In such a configuration, the heat transfer through the circuit substrate 10 can be avoided. It should be noted that the signal lines L1 to L10 made from the bonding wires described above can be fabricated in a simple way when wire-bonding contact electrodes of the chip.

In addition, the package 20 shown in FIG. 3 is formed by using a resin mold. However, the package 20 can also be formed by using a variety of well-known packaging techniques. In addition, the power-substrate portion 1a and the control-substrate portion 1b shown in FIG. 3 are accommodated in the same package. As described below, however, it is also possible, however, to accommodate the power-substrate portion 1a and the control-substrate portion 1b in two separate packages and connect them to each other by using the signal lines L1 to L10. Furthermore, by employing IGBTs and bipolar transistors in the three-phase full-wave rectifier 2 and the field-current controlling switch 3, similar effects can be obtained.

On top of that, diodes can also be employed in the three-phase full-wave rectifier 2. In this case, the controller 4 needs to control only the field-current controlling switch 3. In addition, by replacing Si-MOSFETs 2a to 2f and the Si-MOSFET employed in the field-current controlling switch 3 by SiC-MOSFETs which can operate at high temperatures and have a high withstand voltage but incur little loss, the amount of dissipated heat can further be made even smaller.

That is, the forbidden band of monocrystalline SiC is 2.9 eV, a large value in comparison with a forbidden band of 1.1 eV for monocrystalline Si. As a result, in the case of monocrystalline SiC, the potential barrier of the PN junction can be sustained at a temperature of several hundreds of degrees Centigrade, making it possible to operate the SiC-MOSFET at temperatures higher than the operating temperatures of the Si-MOSFET. In addition, in a circuit requiring a high withstand voltage as is the case with transistors for controlling the generator, the use of an SiC-MOSFET allows the withstand-voltage layer to be made thinner than that of an Si-MOSFET. On the top of that, an SiC-MOSFET has an excellent carrier mobility that reduces the on resistance, thereby allowing a circuit which incurs little loss to be implemented.

Figure 7:
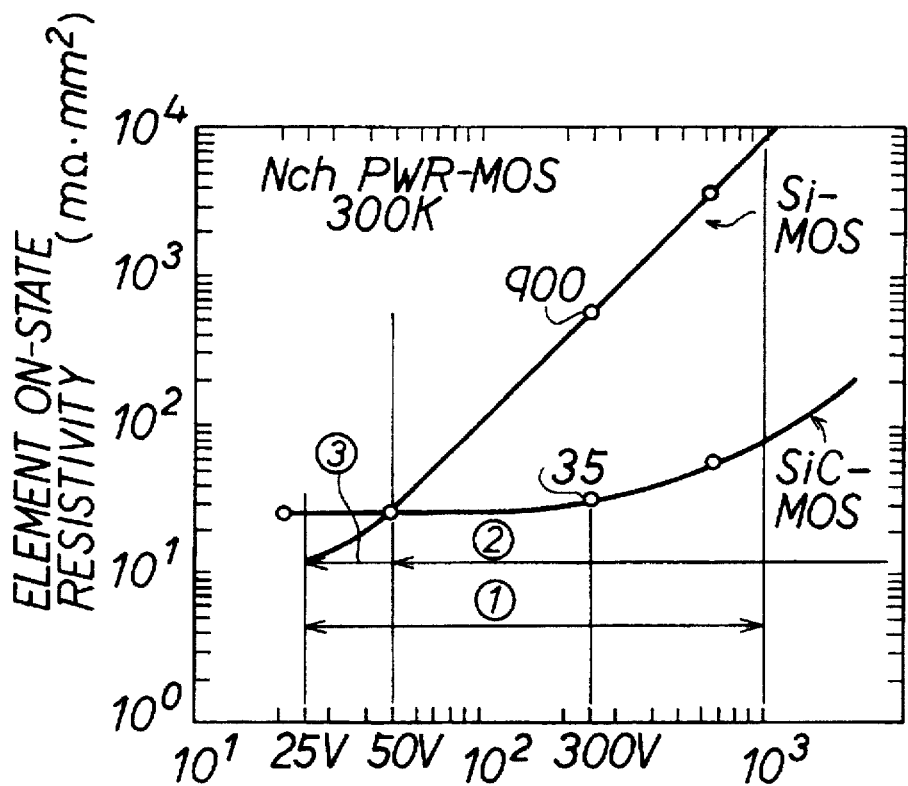
FIG. 7 is a graph of relationships between the withstand voltage and the on resistance for an Si-MOSFET and an SiC-MOSFET.

Relations between the device withstand voltage and the on resistance for MOSFETs made of monocrystalline Si and monocrystalline SiC are shown in FIG. 7.

When an output line of the generator is cut off, energy in the generator appears as a surge voltage. Accordingly, transistors for controlling the generator are generally required to have a withstand voltage in the range 100 to 300 V or even higher. It is obvious from the FIG. that, in this range, the SiC-MOSFET has a low on resistance in a device conductive state in comparison with the Si-MOSFET. At a withstand voltage of 250 V, for example, the on resistance of a MOSFET made from the Si material is 600 mm$\Omega$·mm$^2$ while the on resistance of a MOSFET made of the SiC material is 30 mm$\Omega$·mm$^2$, or 1/20 of the on resistance of the Si-MOSFET. That is, by employing SiC-MOSFETs in the AC-DC power converter and the field-current controller, the amount of loss incurred in the devices is reduced to 1/20 and, as a result, the power generation efficiency is enhanced. Similarly, since the amount of heat dissipated in the devices is reduced to 1/20, the temperature of the generator can be prevented from rising due to heat generated in the armature windings and the like and, at the same time, it is possible to simplify the radiator structure of the devices.

Furthermore, since the SiC-MOSFET can operate at high temperatures, the three-phase full-wave rectifier 2 and the field-current controlling switch 3 can operate at a high temperature such as, typically, 200° C. with the thermal resistance between the three-phase full-wave rectifier 2 and the controller 4 and the thermal resistance between the field-current controlling switch 3 and the controller 4 set at high values as described above. As a result, the cooling system of the three-phase full-wave rectifier 2 and the field-current controlling switch 3 further can be made even simpler.

Assuming that the operating temperature of the SiC-MOSFET is 100° C. and the ambient temperature of the generator is 30° C., the temperatures of the transistors and the substrate for mounting the transistors under the same conditions as those for the Si-MOSFET are calculated to be about 180° and 175° C., respectively. As a result, by thermally isolating the controller 4 including a silicon integrated circuit with requirements including operating temperatures of 130° to 150° C. or lower from the three-phase full-wave rectifier 2 and the field-current controlling switch 3, it is possible to make the cooling system of the three-phase full-wave rectifier 2 and the field-current controlling switch 3, which are made up of SiC, extremely simple.

It will be readily apparent to those of ordinary skill in the art that the above-described structures for increasing the thermal resistance between the voltage controller 4 and either or both of the three-phase full-wave rectifier 2 and the field-current controlling switch 3, such as the thin-substrate portions 1c and bent portions thereof, as well as other structures performing similar functions to be described in greater detail below, correspond to the various thermal conduction means recited in the appended claims.

Figure 8:
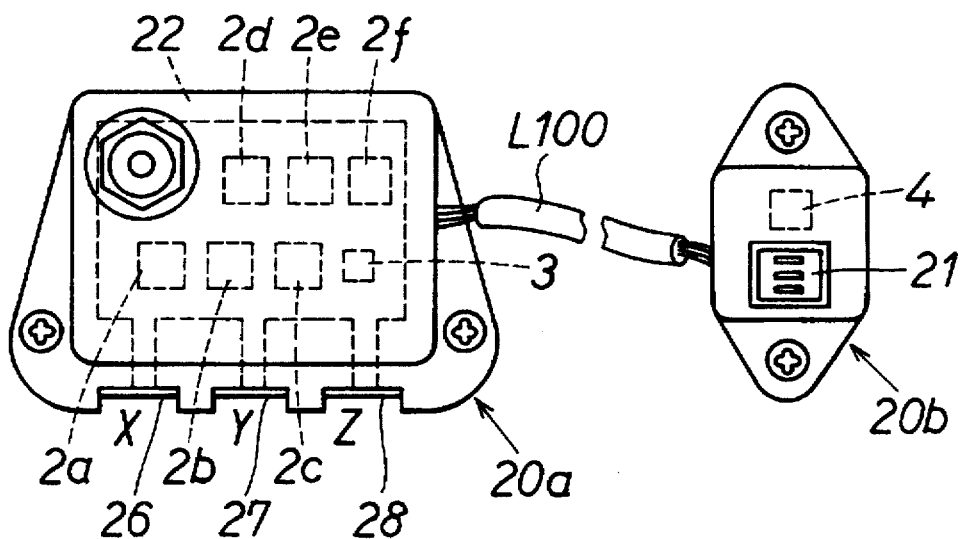
FIG. 8 is a front view of a second preferred embodiment according to the present invention.

A second preferred embodiment of the present invention is explained by referring to FIG. 8.

In the case of the present embodiment, the three-phase full-wave rectifier 2 and the field-current controlling switch 3 are accommodated in a package 20a, the controller 4 in a package 20b and the packages 20a and 20b are connected to each other by a cable L100 for accommodating the signal lines L1 to L10 shown in FIG. 1. The packages 20a and 20b accommodate the power-substrate portion 1a and the control-substrate portion 1b shown in FIG. 3, respectively. The thin-substrate portions 1c are eliminated. Since other details are the same as FIGS. 3 and 4, their explanation is omitted.

In this way, even though the second embodiment has more components than components accommodated in the package 20 of the first embodiment, the amount of heat conducted from the three-phase full-wave rectifier 2 and the field-current controlling switch 3 to the controller 4 can be made even smaller than that of the first embodiment. On the top of that, by sharing the radiator system (that is, the radiator path) among the three-phase full-wave rectifier 2 and the field-current controlling switch 3, the reduction of the maximum temperatures of the three-phase full-wave rectifier 2 and the field-current controlling switch 3 can be realized.

It should be noted that, in the case of the present embodiment, the controller 4 is molded in the package 20b along with a lead frame (not shown) and the external ends of the lead frame are connected to the cable L100 and a connector 21. In addition, the controller 4 is fixed to the body of the vehicle (not shown) instead of the generator. In this way, the temperature of the controller 4 can be made even lower. Also, the three-phase full-wave rectifier 2 and the field-current controlling switch 3 which receive and supply a large current from and to the generator are fixed on the generator, thus allowing the amount of loss incurred along wires connecting the generator to the three-phase full-wave rectifier 2 and the field-current controlling switch 3 to be reduced.

Figure 9:
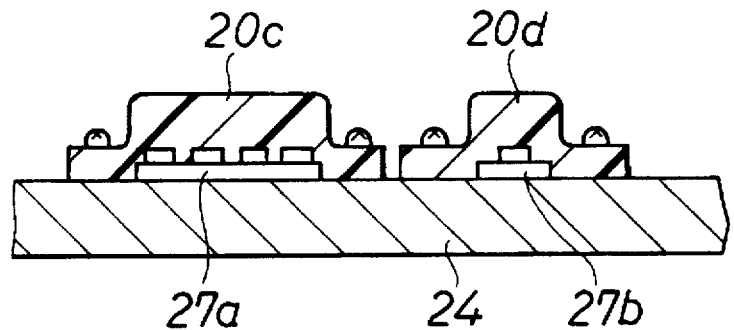
FIG. 9 is a vertical cross-sectional of a third preferred embodiment according to the present invention.

In a third preferred embodiment of the present invention shown in FIG. 9, the isolation circuit substrate 27a for mounting the three-phase full-wave rectifier 2 and the isolation circuit substrate 27b for mounting the field current controlling switch 3 are further accommodated in two separate packages 20c and 20d, respectively.

That is, a plurality of chips composing the three-phase full-wave rectifier 2 are mounted on the isolation circuit substrate 27a and wired thereto whereas a single chip serving as the field-current controlling switch 3 is mounted on the isolation circuit substrate 27b and wired thereto. Packages 20c and 20d for accommodating the isolation circuit substrates 27a and 27b, respectively, are made from isolation resin in a resin molding process. The packages 20c and 20d are fixed on the radiator plate 24, which is made of aluminum. The radiator plate 24 is in turn fixed on the external surface of the rear frame 200 of the generator.

It should be noted that signal lines or electrodes in this embodiment are exposed to the outside by creating, through insertion, connector terminals having a lead shape on the packages 20c and 20d made of isolation resin in advance, carrying out wire-bonding on the contact region of the chip and the connector terminals having a lead shape, and attaching a connector connected to one end of a cable (not shown) thereto. It should be noted that the connector terminals themselves are also not shown in the Figure. In addition, the controller 4 is not fixed to the radiator plate 24 but is instead installed as a separate unit apart from the generator.

In this way, the three-phase full-wave rectifier 2 and the field-current controlling switch 3 radiate heat through the radiator plate 24 serving as a radiator system common to the three-phase full-wave rectifier 2 and the field-current controlling switch 3, thus exhibiting the effects of the present invention described above.

Figure 10:
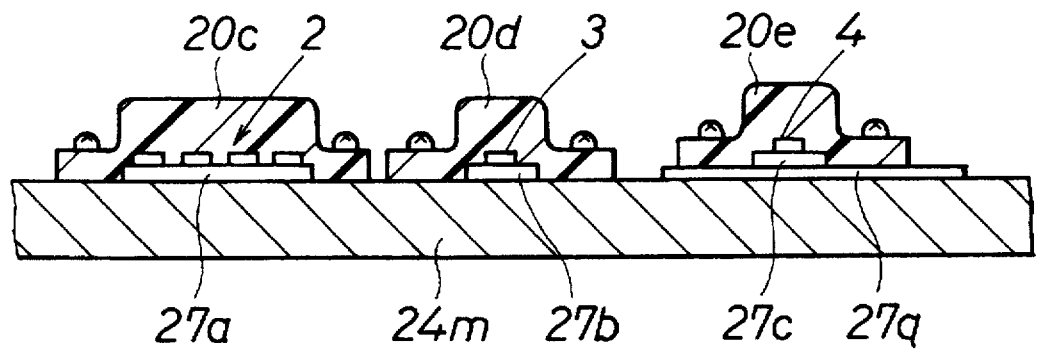
FIG. 10 is a vertical cross-sectional view of a fourth preferred embodiment according to the present invention.

In a fourth preferred embodiment of the present invention shown in FIG. 10, an isolation circuit substrate 27c for mounting the controller 4 shown in FIG. 9 is further fixed on the radiator plate 24. Much like the isolation circuit substrates 27a and 27b, the isolation circuit substrate 27c is accommodated in a package 20e which is made of isolation resin in a resin molding process. The package 20e is separate from the three-phase full-wave rectifier 2 and the field-current controlling switch 3 and is connected in the same way as the three-phase full-wave rectifier 2 and the field-current controlling switch 3.

It should be noted, however, that in the case of this embodiment, in order to increase the thermal resistance between the controller 4 and a radiator plate 24m, an isolation resin plate 27q is provided between the isolation circuit substrate 27c and the radiator plate 24m. The isolation resin plate 27q has a coefficient of thermal conductivity much lower than those of the isolation circuit plates 27a to 27c, thus preventing heat from being conducted from the three-phase full-wave rectifier 2 and the field-current controlling switch 3 to the controller 4 through the radiator plate 24m.

In this way, it is possible to obtain effects similar to those of the previously-described embodiments.

It should be noted that, as a variation on this embodiment, the isolation circuit substrates 27a to 27c can be directly fixed on the rear frame 200 of the generator without providing the radiator plate 24m therebetween. Also, the isolation resin plate 27q may be provided between the isolation circuit substrate 27c and the rear frame 200.

Figure 11:
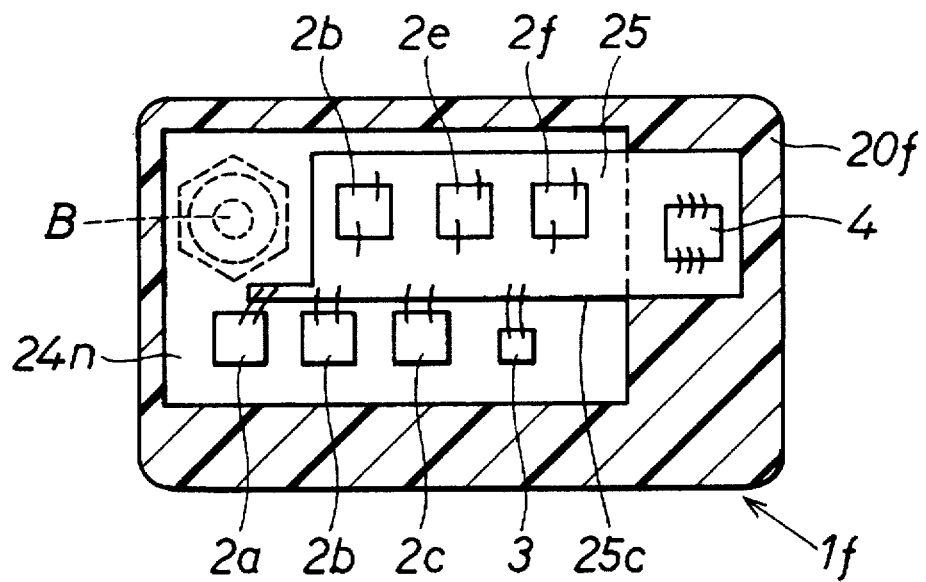
FIG. 11 is a vertical cross-sectional view of a fifth preferred embodiment according to the present invention.

In a fifth preferred embodiment of the present invention shown in FIG. 11, the B terminal is fixed on the back side of the chip mounting surface of the radiator plate 24n. Much like the cross section shown in FIG. 4, the surface opposite to the surface for mounting the B terminal of the radiator plate 24n is used as a chip mounting surface. On the chip mounting surface of the radiator plate 24n, the semiconductor chips serving as the high-side switches 2a to 2c and the field-current controlling switch 3 are directly fixed by soldering or by using a conductive adhesive agent. In addition, an isolation circuit substrate 25 is fixed on the chip mounting surface of the radiator plate 24n and the low-side switches 2d to 2f and the controller 4 are fixed on the isolation circuit substrate 25. It should be noted that the low-side switches 2d to 2f are in contact with the radiator plate 24n through the isolation circuit substrate 25 and the controller 4 is fixed on a portion of the isolation circuit substrate 25 which is not joined to the radiator plate 24n. It is also worth noting that the chips 2a to 2f, 3 and 4 are wired on the isolation circuit substrate 27 in a wire-bonding process. The radiator plate 24n also includes a line L11 for connecting the source electrodes of the high-side switches 2a to 2c to the B terminal as shown in FIG. 1 as well as a line L12 for connecting the drain electrode of the field-current controlling switch 3 to the B terminal as shown in FIG. 1. In the case of this arrangement, the work to assemble the circuit is carried out in a resin molding process to form a package 20f. At that time, the back surface of the surface for mounting chips of the radiator plate 24n is exposed and radiator fins (not shown) are fixed thereon. In addition, the B terminal is also a kind of radiator fin.

Since the high-side switches 2a to 2c and the field-current controlling switch 3 are directly fixed on the radiator plate 24n, the thermal resistance between the high-side switches 2a to 2c and the radiator plate 24n and the thermal resistance between the field-current controlling switch 3 and the radiator plate 24n are small in comparison with the controller 4 fixed on the package 20 through the isolation circuit substrate 25a, thus allowing the effects of the embodiments described above to be exhibited.

In this embodiment, the four chips serving as the high-side switches 2a to 2c and the field-current controlling switch 3 are MOSFETs of the N-channel type, each using an N+ type substrate. The N+ substrate also serves as the source electrodes of the high-side switches 2a to 2c and the drain electrode of the field-current controlling switch 3. In this way, the wiring substitute effect of the radiator plate 24n described above can be exhibited. In addition, the wiring in this embodiment can be made simple.

It should be noted that the high-side switches 2a to 2c can also be fixed on the radiator plate 24n through an isolation circuit substrate.

Figure 12:
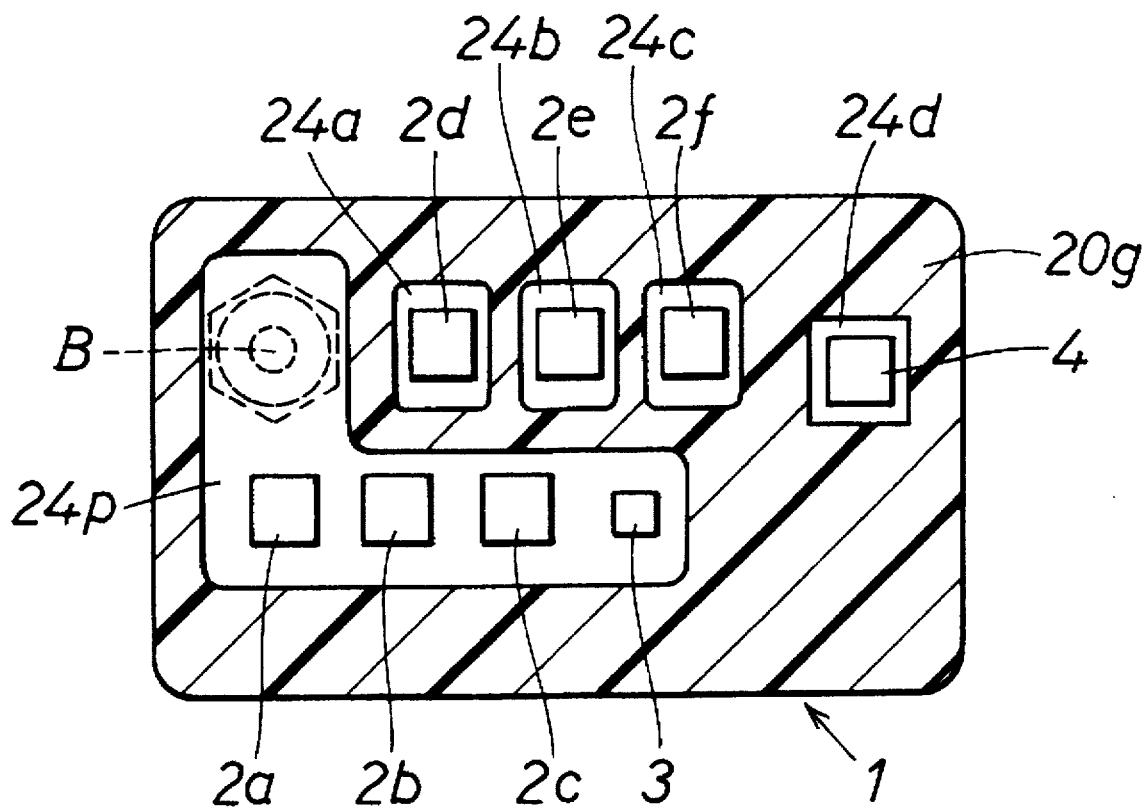
FIG. 12 is a vertical cross-sectional view of a sixth preferred embodiment according to the present invention.

A sixth preferred embodiment of the present invention shown in FIG. 12 implements the output controlling apparatus shown in FIG. 1 in a lead frame resin mold IC.

That is, a lead frame including a radiator plate 24p, islands 24a to 24d for mounting chips and required wiring leads (not shown) is created by punching an aluminum thin plate into a predetermined pattern. The high-side switches 2a to 2c and the field-current controlling switch 3 which are each accommodated in a chip are fixed on the radiator plate 24p whereas the low-side switches 2d, 2e and 2f and the controller 4 are fixed on the islands 24a to 24d, respectively. In addition, the B terminal is soldered to the back side of the surface for mounting chips on the radiator plate 24p and then a package 20g is created by an insert resin molding process. Finally, the process is completed by cutting unnecessary lead contacts outside the package 20g.

The back side of the chip mounting surfaces of the radiator plate 24p and the islands 24a to 24c can be exposed for radiating heat. In addition, it is also possible to devise a configuration wherein the back sides of the chip mounting surfaces of the radiator plate 24p and the islands 24a to 24c are not exposed for radiating heat if the switching devices operate at temperatures in a permissible range, allowing heat to be conducted only to the B terminal or connection lines (not shown) to stator leads connected to the islands 24a to 24c.

Also in the case of this embodiment, the thermal resistance between the three-phase full-wave rectifier 2 and the field-current controlling switch 3 is extremely small. In comparison, the thermal resistance between the controller 4 and the three-phase full-wave rectifier 2 and the thermal resistance between the controller 4 and the field-current controlling switch 3 can be made large, thus allowing the effects of the present invention described above to be exhibited.

Figure 13:
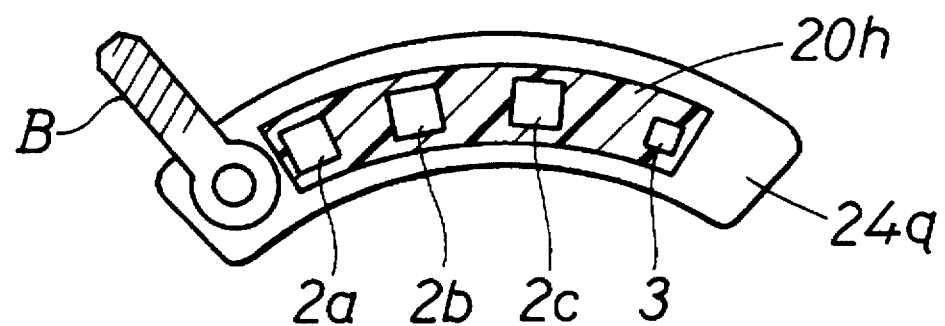
FIG. 13 is a diagram of a vertical cross-sectional view of a seventh preferred embodiment according to the present invention.

In a seventh preferred embodiment of the present invention shown in FIG. 13, the high-side switches 2a to 2c and the field-current controlling switch 3 are directly mounted on the radiator plate 24q as in the previous embodiment. However, in this embodiment the radiator plate 24q also serves as a push bar. In addition, in the case of this embodiment, the radiator plate 24q is installed as a body separately from the other low-side switches 2d to 2f and the controller 4. Reference numeral 20h denotes a mold resin or similar packaging material.

Figure 14:
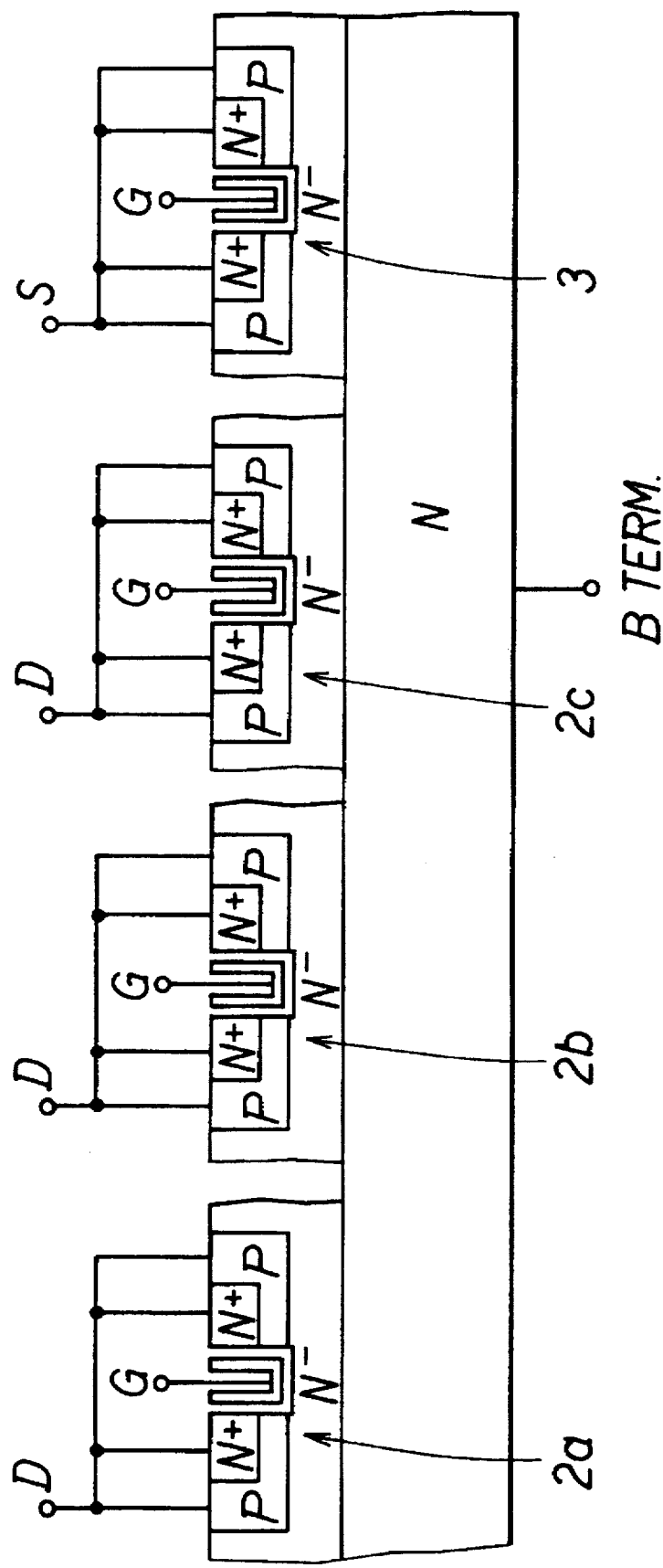
FIG. 14 is a vertical cross-sectional view of a semiconductor chip according to an eighth preferred embodiment according to the present invention.

In an eighth preferred embodiment of the present invention shown in FIG. 14, the field-current controlling switch 3 and the high-side switches 2a to 2c employed in the three-phase full-wave rectifier 2 shown in FIGS. 12 and 13 are each a vertical-type channel NMOSFET. These MOSFETs 2a to 2c and 3 are integrated in a single chip.

That is to say, the MOSFETs 2a to 2c and 3 are each a vertical-type channel NMOSFET. Since their N+substrates have the same potential, they can be integrated into a single chip. It is not necessary to short the N− withstand-voltage layers of the MOSFETs 2a to 2c and 3 in order to set the potential of a P well region, thus giving rise to a high withstand voltage. Of course, this chip can be fixed on the radiator plate 24p or 24q using a resin molding process.

Figures 15A, 15B:
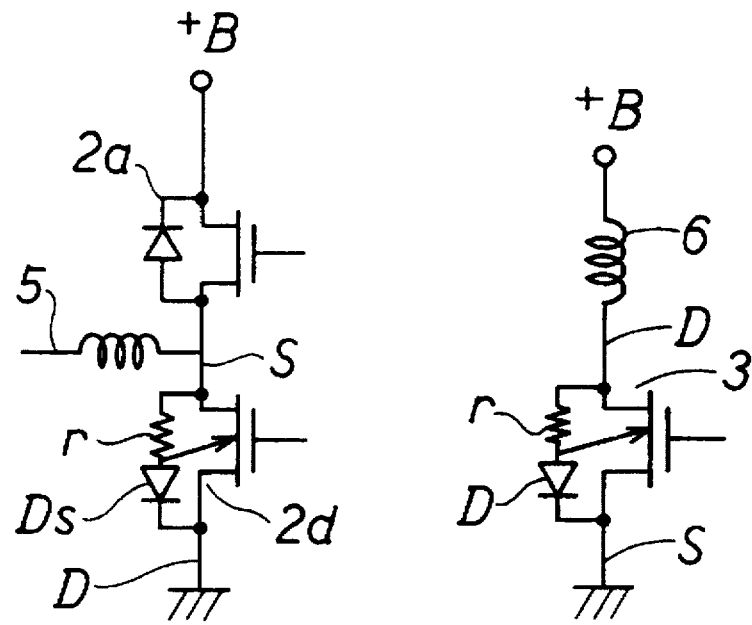
FIGS. 15A and 15B are schematic diagrams of a ninth preferred embodiment according to the present invention.

In a ninth preferred embodiment of the present invention shown in FIGS. 15 to 17, FIG. 15A is a circuit diagram showing a field-current controlling switch 3s, the MOSFET serving as the field-current controlling switch 3 of FIG. 11 implemented into the same configuration as a low-side switch. Further, in this embodiment, the P well regions of the low-side switches 2d to 2f employed in the three-phase full-wave rectifier 2 are each set at a potential through a high-resistance resistor r from the source electrode thereof (that is, the main electrode on the side of the armature winding 5) as shown in FIG. 15A whereas the P well region of the field-current controlling switch 3s is set at a potential through a resistor r having a high resistance from the drain electrode thereof (that is, the main electrode on the side of the field winding 6) as shown in FIG. 15B.

Figure 16:
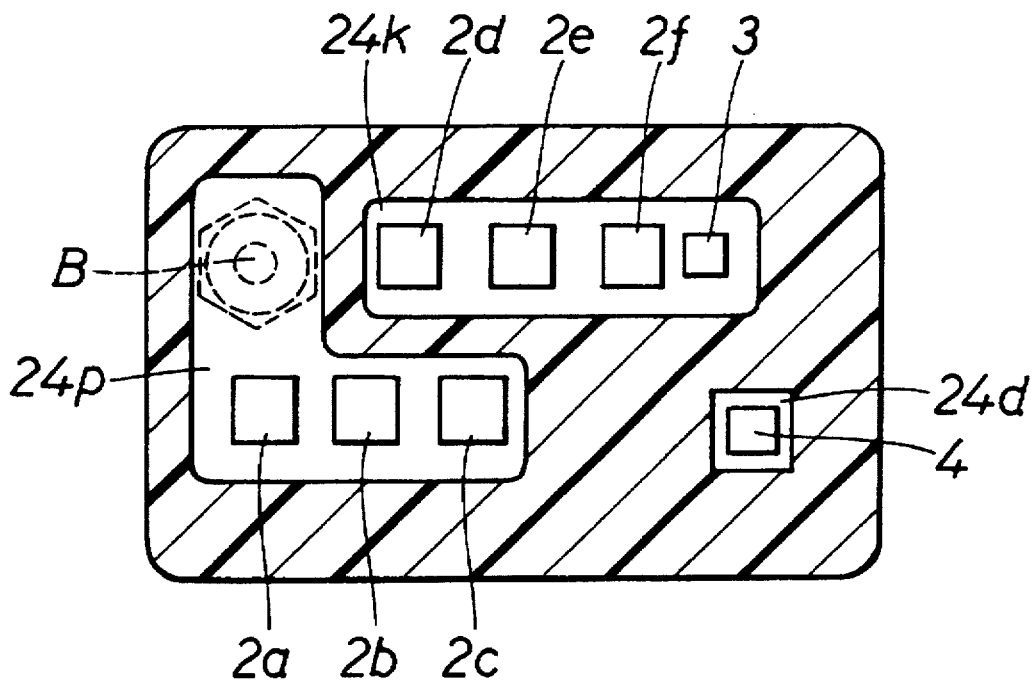
FIG. 16 is a vertical cross-sectional view of the ninth embodiment.
Figure 17:
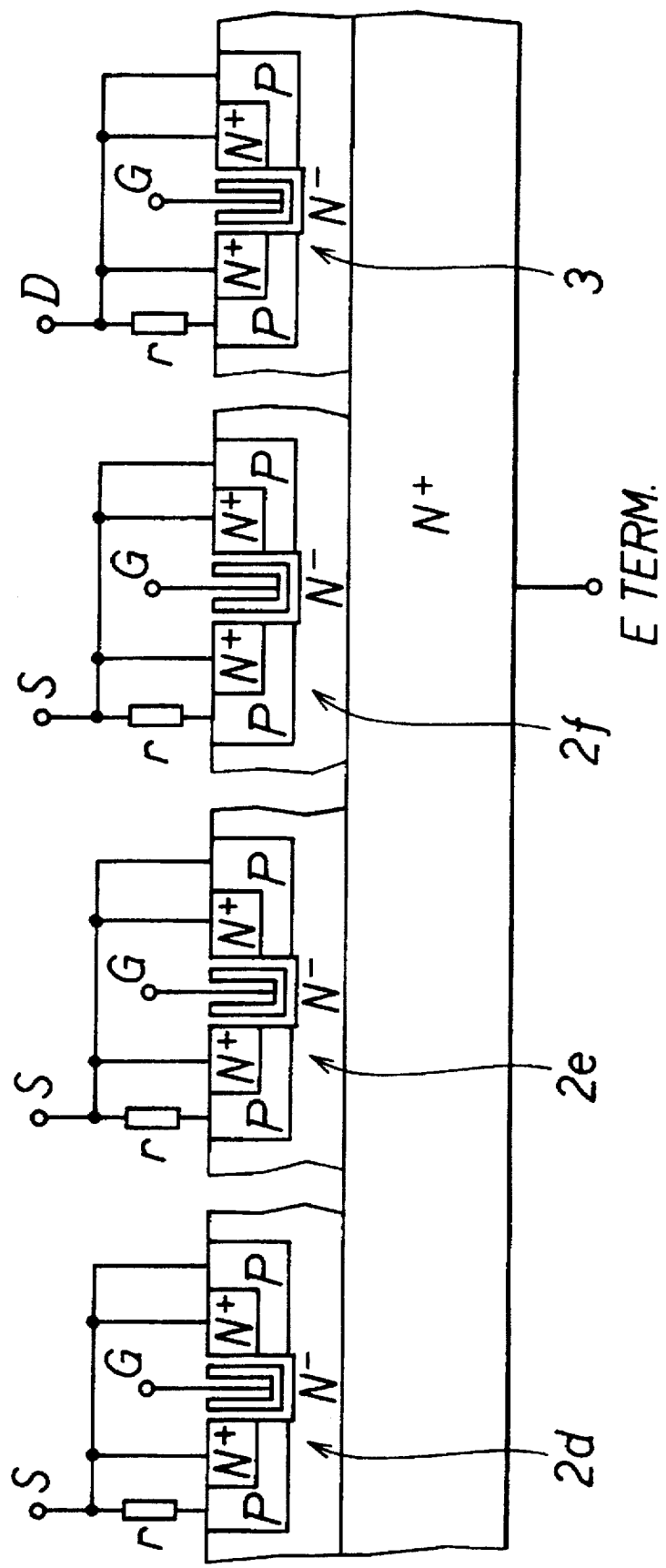
FIG. 17 is a vertical cross-sectional view of a semiconductor chip implemented in a variation on the ninth embodiment.

In this way, the drain electrodes of the low-side switches 2d to 2f and the source electrode of the field-current controlling switch 3s can be set at a common potential, that is, ground potential. As a result, the low-side switches 2d to 2f can be directly fixed on a radiator plate 24k which is used as a ground electrode E or a connection conductor to the ground electrode E as shown in FIG. 16. Furthermore, according to this embodiment, the MOSFETs composing the low-side switches 2d to 2f and the field-current controlling switch 3s can also be integrated on a single chip as shown in FIG. 17. Notation r denotes a resistor having a high resistance which is typically a polysilicon resistor.

In addition, the N+ substrate of the chip for the low-side switches 2d to 2f and the field-current controlling switch 3s having the circuit configurations thereof shown in FIG. 15 can be grounded. As a result, the low-side switches 2d to 2f and the field-current controlling switch 3 can be accommodated in a single package which can be directly fixed on the housing of the generator, thereby resulting in a simplified structure and a simple installation.

Figure 18:
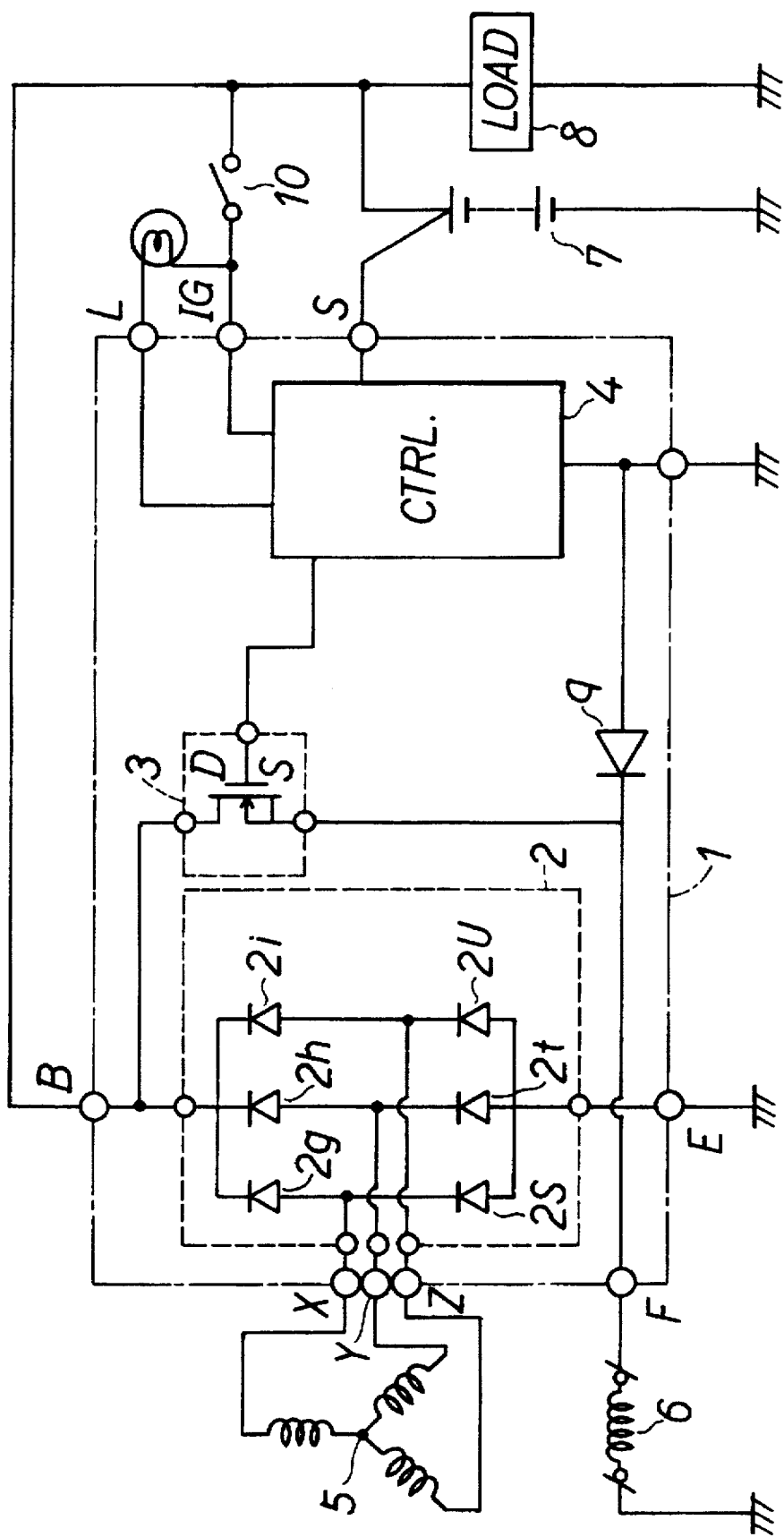
FIG. 18 is a schematic diagram of a tenth preferred embodiment of the present invention.
Figure 19:
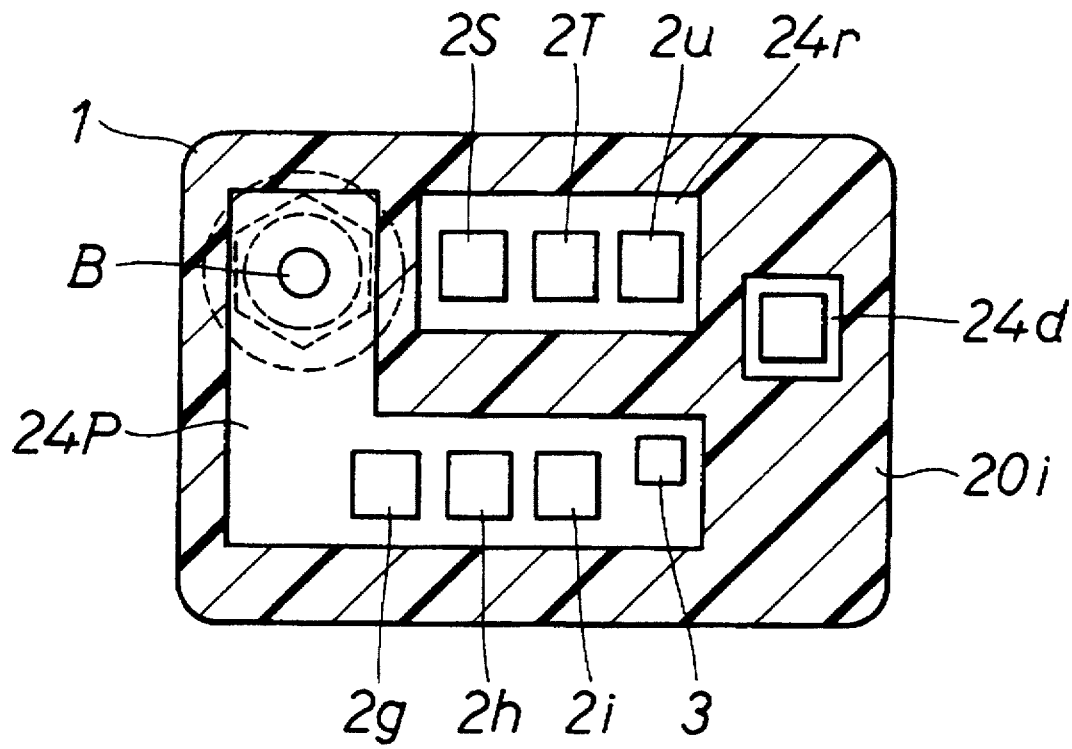
FIG. 19 is a vertical-cross sectional view of the tenth embodiment.

In a tenth preferred embodiment of the present invention shown in FIGS. 18 and 19, the MOSFETs 2a to 2f composing the three-phase full-wave rectifier 2 shown in FIG. 12 are replaced by diodes 2g to 2i and 2s to 2u. In this configuration, the controller 4 thus needs to control only the field-current controlling switch 3.

In addition, in this embodiment, the diodes 2s to 2u on the low side can be fixed on a common island which serves as a radiator plate 24r. Of course, the diodes 2g to 2i on the high side are fixed on the radiator plate 24p. Reference numeral 20i denotes a package created by an insert resin molding process.

Much like the sixth embodiment shown in FIG. 12, the radiator plates 24p, 24r and 24d are created in a resin mold process into a lead frame along with leads (not shown). Of course, the radiator plate 24r becomes the ground electrode E.

In FIG. 19, the N+ semiconductors of the diodes 2g to 2i on the high side and the P+ semiconductors of the diodes 2s to 2u on the low side are of course connected to the radiator plates 24p and 24r, respectively.

Also in the case of this embodiment, the controller 4 is thermally isolated from the radiator plates 24a and 24b so that the thermal resistance between the controller 4 and the field-current controlling switch 3 and the thermal resistance between the controller 4 and the three-phase full-wave rectifier 2 are sufficiently reduced by the radiator plate 24p.

This embodiment can also provide the effect of efficient utilization of a cooling system through sharing of the cooling system by the three-phase full-wave rectifier 2 and the field-current controlling switch 3. Efficient use is also promoted by simplification of the cooling system in spite of the use of the three-phase full-wave rectifier 2 and the field-current controlling switch 3 at high temperatures due to the deliberate thermal isolation of the controller 4 from the three-phase full-wave rectifier 2 and the field-current controlling switch 3.

Figure 20:
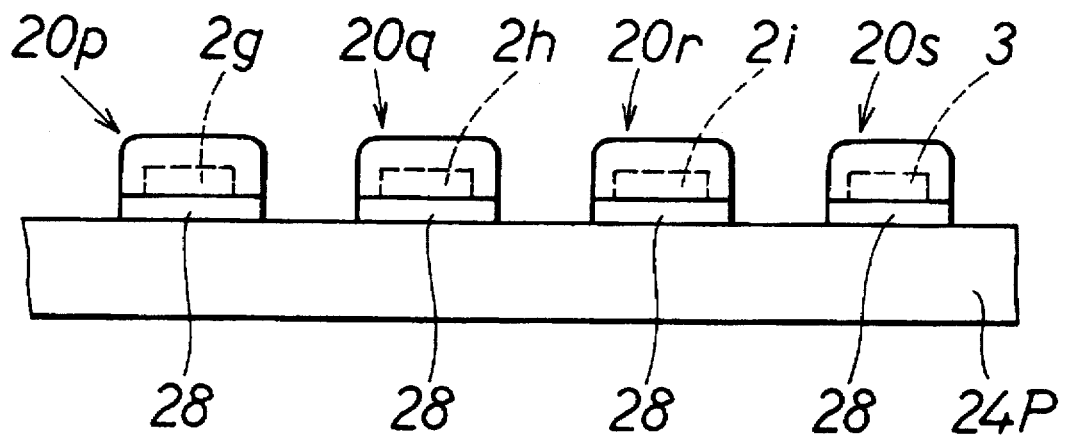
FIG. 20 is a vertical cross-sectional view of an eleventh preferred embodiment according to the present invention.

In an eleventh preferred embodiment of the present invention shown in FIG. 20, the diodes 2g to 2i on the high side and the field-current controlling switch 3 employed in the tenth embodiment are each integrated in a single chip. The chips are accommodated in separate packages 20p to 20s which are each created in a resin molding process. The packages 20p to 20s are fixed on the radiator plate 24p. It should be noted that reference numeral 28 denotes an aluminum base on which the packages 2g to 2i and 3 are fixed. That is to say, the resin molds are created on the aluminum base.

Also, in this embodiment, the thermal resistance between the three-phase full-wave rectifier 2 and the field-current controlling switch 3 can be reduced as well.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An output controlling apparatus for an alternating-current generator, said apparatus comprising:
    an AC-DC power converter including a plurality of semiconductor switching devices serving as high-side switches for connecting output terminals of armature windings of said alternating-current generator to a high-potential DC output, and a plurality of semiconductor switching devices serving as low-side switches for connecting said output terminals of said armature windings to a low-potential DC output, said AC-DC power converter being for rectifying a voltage output by said alternating-current generator and applying said rectified voltage to a battery;

a field-current controller including a semiconductor switching device, said field current controller being for turning a field current flowing through a field winding of said alternating-current generator on and off;

a voltage controller, connected to said semiconductor switching devices of said AC-DC power converter and connected to said semiconductor switching device of said field-current controller, for controlling at least one of a) said semiconductor switching devices of said AC-DC power converter, and b) said semiconductor switching device of said field-current controller, to sustain a voltage of said battery at a predetermined level, said voltage controller including a semiconductor integrated circuit;

first thermal conduction means, having a first thermal resistance, for transmitting thermal energy between said AC-DC power converter and said field-current controller at a rate determined by said first thermal resistance;

second thermal conduction means, having a second thermal resistance, for transmitting thermal energy between said AC-DC power converter and said voltage controller at a rate determined by said second thermal resistance; and third thermal conduction means, having a third thermal resistance, for transmitting thermal energy between said field-current controller and said voltage controller at a rate determined by said third thermal resistance;

wherein said first thermal resistance is smaller than said second thermal resistance and said third thermal resistance.

2. An output controlling apparatus according to claim 1, wherein said AC-DC power converter and said field-current controller are fixed on a housing of said alternating-current generator.

3. An output controlling apparatus according to claim 2, wherein said AC-DC power converter, said field-current controller and said voltage controller are accommodated in a common package.

4. An output controlling apparatus according to claim 2, wherein said AC-DC power converter and said field-current controller are accommodated in a power package whereas said voltage controller is accommodated in a control package different from said power package.

5. An output controlling apparatus according to claim 2, wherein said AC-DC power converter, said field-current controller and said voltage controller are accommodated in three different packages.

6. An output controlling apparatus according to claim 1, wherein said AC-DC power converter and said field-current controller are fixed on a housing of said alternating-current generator whereas said voltage controller is installed as a unit separate from said alternating-current generator.

7. An output controlling apparatus according to claim 1, wherein said AC-DC power converter and said field-current controller are fixed on a common good heat conductive substrate which is fixed on a housing of said alternating-current generator.

8. An output controlling apparatus according to claim 1, at least one of said first, second and third thermal conduction means including thermal resistance means for reducing an amount of heat conducted from said AC-DC power converter and said field-current controller to said voltage controller, said thermal resistance means being disposed at least one of a position between said AC-DC power converter and said voltage controller and a position between said field-current controller and said voltage controller.

9. An output controlling apparatus according to claim 8, wherein:

said thermal resistance means includes a portion of a connection conductor electrically connecting said AC-DC power converter and said field-current controller to said voltage controller; and a cross-sectional area of said portion is smaller than cross-sectional areas of remaining parts of said connection conductor.

10. An output controlling apparatus according to claim 8, wherein:

said thermal resistance means includes a portion of a connection conductor electrically connecting said AC-DC power converter and said field-current controller to said voltage controller; and said portion has a bent shape.

11. An output controlling apparatus according to claim 1, further comprising:

a radiator member fixed on at least one of said AC-DC power converter and said field-current controller;

fourth thermal conduction means, having a fourth thermal resistance, for transmitting thermal energy between said AC-DC power converter and said radiator member at a rate determined by said fourth thermal resistance;

fifth thermal conduction means, having a fifth thermal resistance, for transmitting thermal energy between said field-current controller and said radiator member at a rate determined by said fifth thermal resistance; and sixth thermal conduction means, having a sixth thermal resistance, for transmitting thermal energy between said voltage controller and said radiator member at a rate determined by said sixth thermal resistance;

wherein said fourth and fifth thermal resistances are smaller than said sixth thermal resistance.

12. An output controlling apparatus according to claim 1, further comprising a resin member between said voltage controller and a housing of said alternating-current generator.

13. An output controlling apparatus according to claim 1, wherein at least one of said semiconductor switching devices employed in said AC-DC power converter and said semiconductor switching device employed in said field-current controller is a MOSFET.

14. An output controlling apparatus according to claim 13 wherein said at least one MOSFET is a monocrystalline SiC MOSFET.

15. An output controlling apparatus according to claim 1, wherein at least one of said semiconductor switching devices employed in said AC-DC power converter and said semiconductor switching device employed in said field-current controller is one of a bipolar transistor and an IGBT.

16. An output controlling apparatus according to claim 1, wherein said semiconductor switching devices employed in said AC-DC power converter are each a diode.

17. An output controlling apparatus for an alternating-current generator, said apparatus comprising:

an AC-DC power converter including a plurality of semiconductor switching devices serving as high-side switches for connecting output terminals of armature windings of said alternating-current generator to a high-potential DC output, and a plurality of semiconductor switching devices serving as low-side switches for connecting said output terminals of said armature windings to a low-potential DC output, said AC-DC power converter being for rectifying a voltage output by said alternating-current generator and applying said rectified voltage to a battery;

a field-current controller including a semiconductor switching device, said field-current controller being for turning a field current flowing through a field winding of said alternating-current generator on and off; and a voltage controller connected to said switching devices of said AC-DC power converter and to said switching device of said field-current controller, for controlling at least one of: a) said semiconductor switching devices of said AC-DC power converter, and b) said semiconductor switching device of said field-current controller, to sustain a voltage of said battery at a predetermined level, said voltage controller including a semiconductor integrated circuit;

wherein said AC-DC power converter and said field-current controller are fixed on a common good heat conductive substrate on a housing of said alternating-current generator.

18. An output controlling apparatus according to claim 17, at least one of said first, second and third thermal conduction means including thermal resistance means for reducing an amount of heat conducted from said AC-DC power converter and said field-current controller to said voltage controller, said thermal resistance means being disposed at least one of a position between said AC-DC power converter and said voltage controller and a position between said field-current controller and said voltage controller.

19. An output controlling apparatus according to claim 18, wherein:

said thermal resistance means includes a portion of a connection conductor electrically connecting said AC-DC power converter and said field-current controller to said voltage controller; and a cross-sectional area of said portion is smaller than cross-sectional areas of remaining parts of said connection conductor.

20. An output controlling apparatus according to claim 18, wherein:

said thermal resistance means includes a portion of a connection conductor electrically connecting said AC-DC power converter and said field-current controller to said voltage controller; and said portion has a bent shape.

21. An output controlling apparatus according to claims 18, wherein said semiconductor switching devices employed in said field-current controller and said high-side switches are fixed on said common good heat conductive substrate, and said substrate is directly connected to a positive pole of said battery to allow electrical conduction thereto.

22. An output controlling apparatus according to claim 18, wherein said semiconductor switching devices employed in said field-current controller and said low-side switches are fixed on said common good heat conductive substrate, and said substrate is directly connected to a negative pole of said battery to allow electrical conduction thereto.

23. An output controlling apparatus according to claim 17, wherein at least one of said semiconductor switching devices employed in said AC-DC power converter and said semiconductor switching device employed in said field-current controller is a MOSFET.

24. An output controlling apparatus according to claim 23 wherein said at least one MOSFET is a monocrystalline SiC MOSFET.

25. An output controlling apparatus according to claim 17, wherein said semiconductor switching devices employed in said AC-DC power converter are each a diode.

26. An output controlling apparatus according to claim 17, wherein said semiconductor switching devices employed in said field-current controller and said high-side switches are integrated in a single semiconductor chip.

27. An output controlling apparatus according to claim 26, wherein said semiconductor switching devices employed in said field-current controller and said high-side switches are integrated in a single semiconductor chip which has an N+ substrate and an N− withstand-voltage layer on said N+ substrate.

28. An output controlling apparatus for an alternating-current generator, said apparatus comprising:

an AC-DC power converter including a plurality of semiconductor switching devices serving as high-side switches for connecting output terminals of armature windings of said alternating-current generator to a high-potential DC output, and a plurality of semiconductor switching devices serving as low-side switches for connecting said output terminals of said armature windings to a low-potential DC output, said AC-DC power converter being for rectifying a voltage output by said alternating-current generator and applying said rectified voltage to a battery;

a field-current controller including a semiconductor switching device, said field-current controller being for turning a field current flowing through a field winding of said alternating-current generator on and off; and a voltage controller connected to said switching devices of said AC-DC power converter and to said switching device of said field-current controller, for controlling at least one of a) said semiconductor switching devices of said AC-DC power converter, and b) said semiconductor switching device of said field-current controller, to sustain a voltage of said battery at a predetermined level;

wherein said AC-DC power converter and said field-current controller are disposed inside a housing of said alternating-current generator whereas said voltage controller is disposed outside said alternating-current generator.

* * * * *